(12) United States Patent
Takano et al.

(10) Patent No.: US 10,845,383 B2
(45) Date of Patent: Nov. 24, 2020

(54) SEMICONDUCTOR WAFER TEST SYSTEM

(71) Applicant: Keysight Technologies, Inc., Santa Rosa, CA (US)

(72) Inventors: Kenichi Takano, Hino (JP); Sumio Shimonishi, Tokyo (JP); Motochika Juso, Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 71 days.

(21) Appl. No.: 16/173,359

(22) Filed: Oct. 29, 2018

(65) Prior Publication Data

US 2020/0132720 A1     Apr. 30, 2020

(51) Int. Cl.
*G01R 1/04* (2006.01)
*G01R 31/28* (2006.01)

(52) U.S. Cl.
CPC ......... *G01R 1/0416* (2013.01); *G01R 1/0491* (2013.01); *G01R 31/2831* (2013.01)

(58) Field of Classification Search
None
See application file for complete search history.

(56) References Cited

U.S. PATENT DOCUMENTS

| | | | |
|---|---|---|---|
| 6,462,532 B1 | 10/2002 | Smith | |
| 6,873,167 B2 | 3/2005 | Goto et al. | |
| 7,096,141 B2 | 8/2006 | Bohan | |
| 7,112,131 B2 | 9/2006 | Rasmussen et al. | |
| 8,087,979 B2 | 1/2012 | Rasmussen | |
| 2003/0082936 A1* | 5/2003 | Goto | G01R 31/2851 439/75 |
| 2004/0160226 A1* | 8/2004 | Ewing | G01R 31/2808 324/538 |
| 2006/0276121 A1* | 12/2006 | Rasmussen | H05K 7/20572 454/184 |

OTHER PUBLICATIONS

Keysight Technologies 4080 Series of Parametric Testers: Are You Ready to Migrate to the Platform that Solves Your Toughest Test Challenges?, 5989-7089EN, Dec. 1, 2017, pp. 1-12.
Keysight 4082A Parametric Test System: Data Sheet, 5989-6508EN, Feb. 6, 2018, pp. 1-28.

* cited by examiner

*Primary Examiner* — Jas A Sanghera

(57) ABSTRACT

A wafer test system includes a cabinet housing multiple instruments, a test head having multiple pin modules, and cable connecting at least some of the instruments to the pin modules. The cabinet has at least one front door, left and right side panels, a rear door, a ceiling unit, and a bottom unit. Each of the instruments has a front surface, left and right side surfaces, and a rear surface. At least some of the instruments each include at least one first connection terminal. The cabinet further includes a first space defined between the at least one front door and the front surface of each of the instruments, and a second space defined between the rear door and the front surface of each of the instruments. The first space and the second space are separated in the cabinet to separate intake air and exhaust air of the instruments.

20 Claims, 16 Drawing Sheets

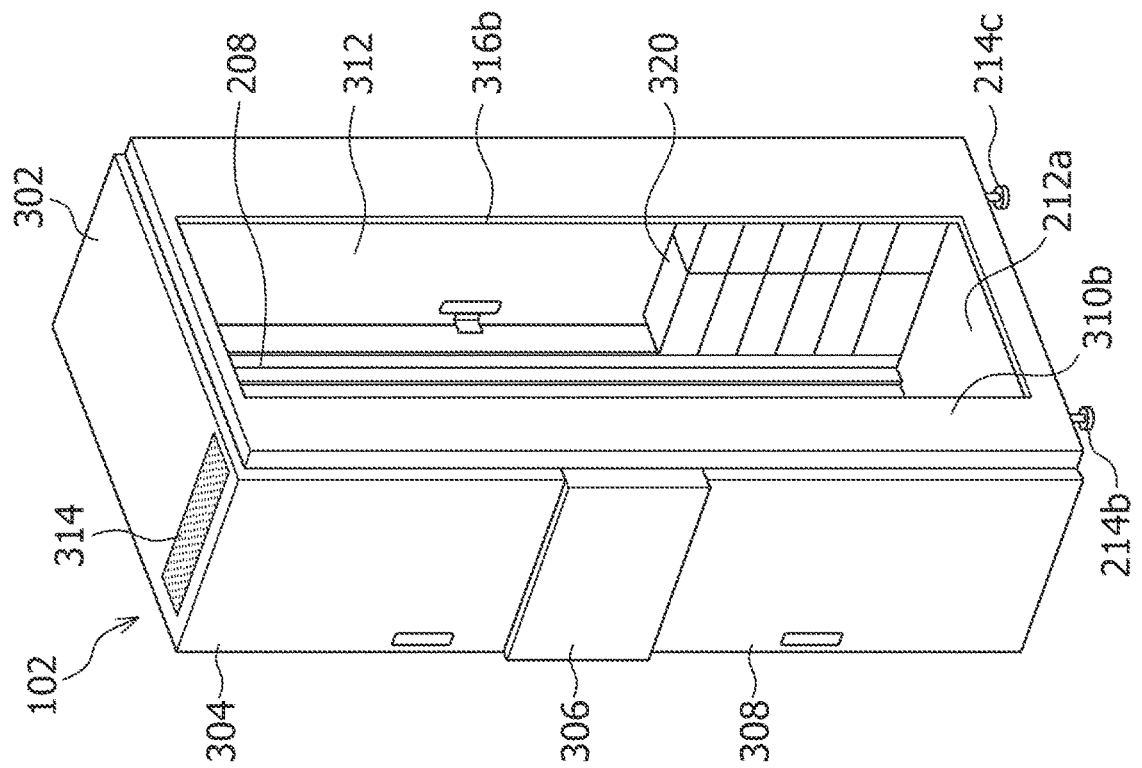
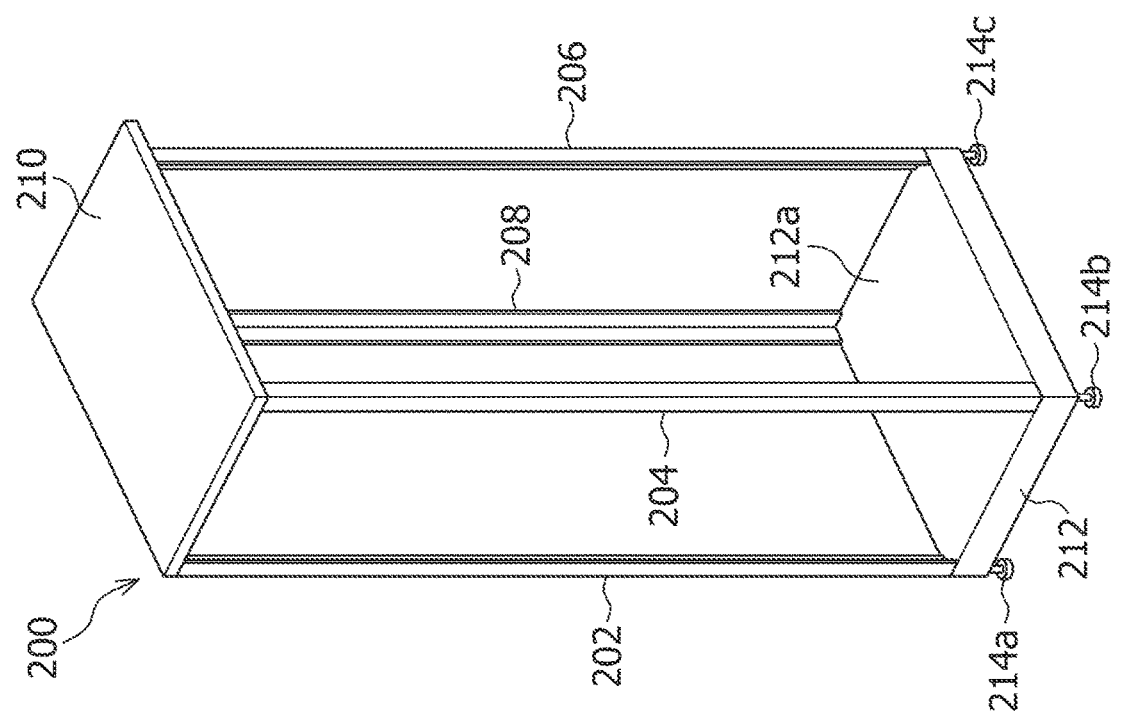

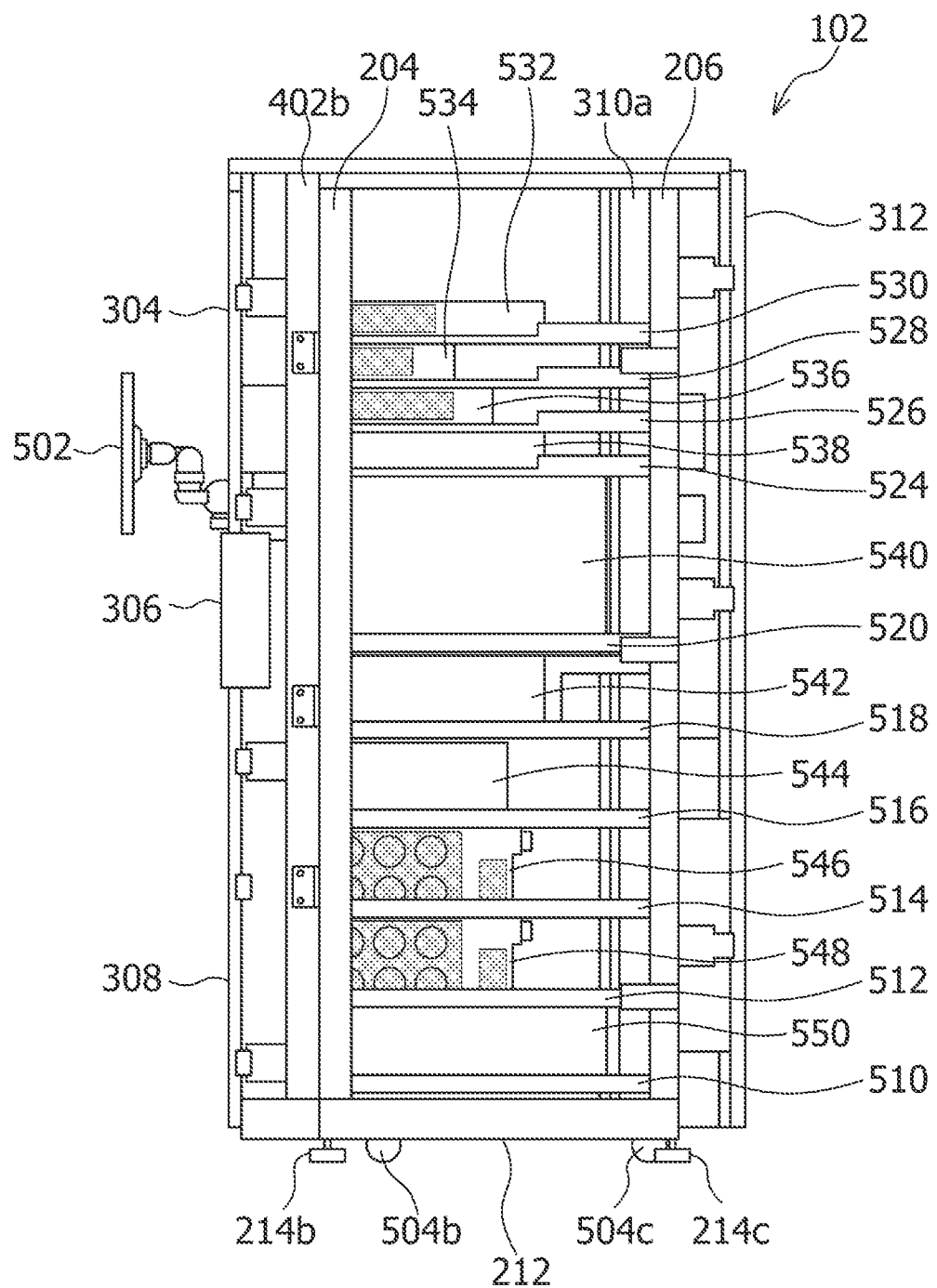

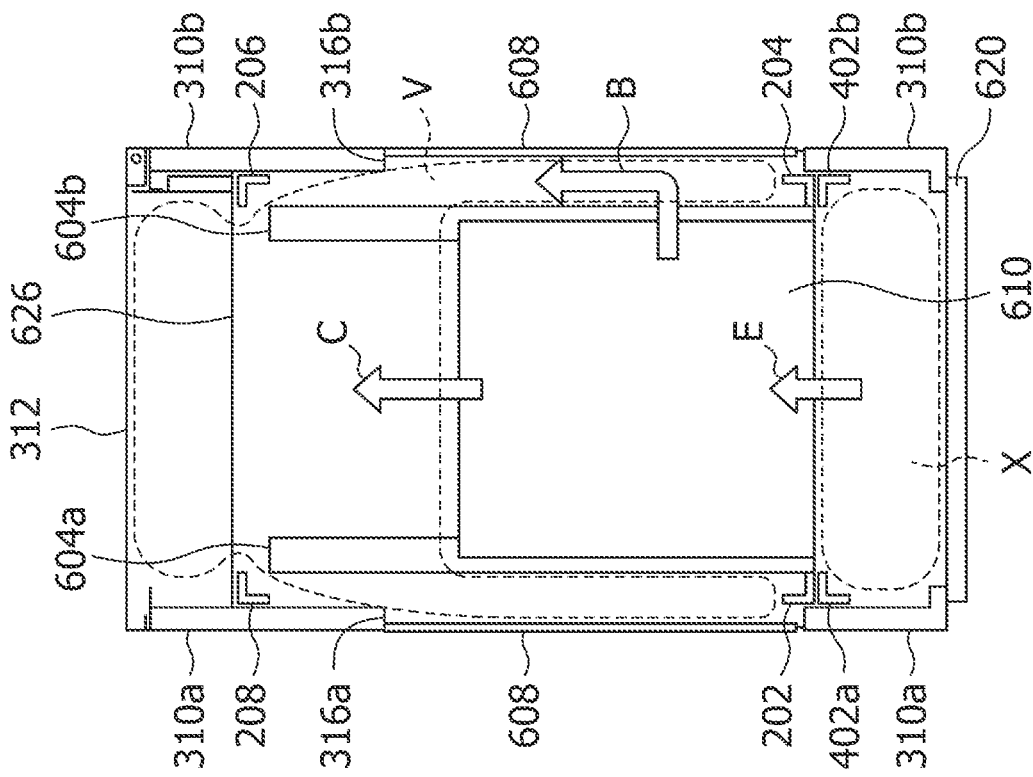
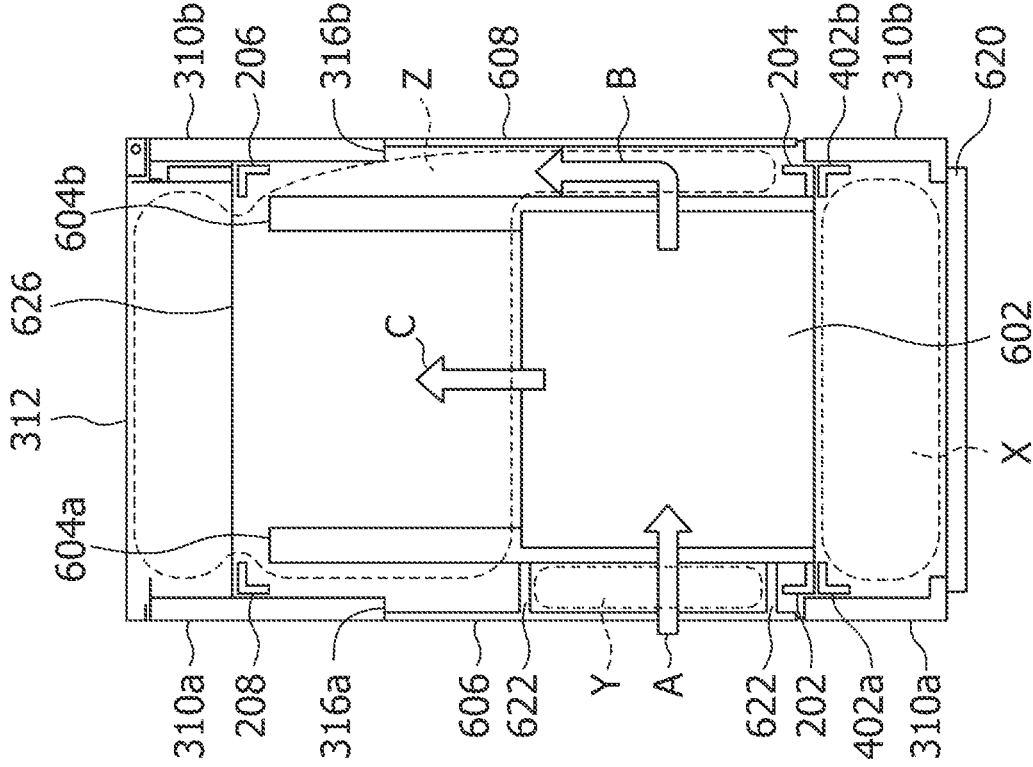

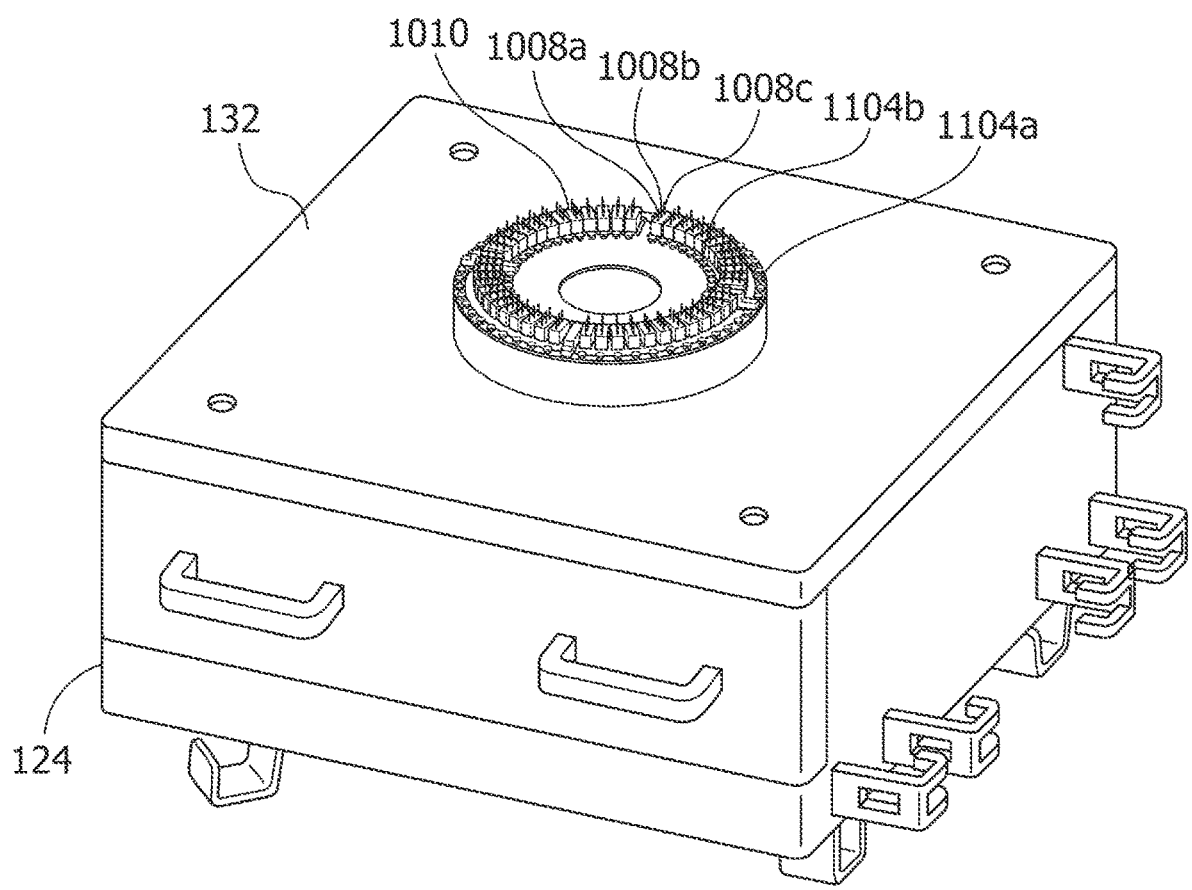

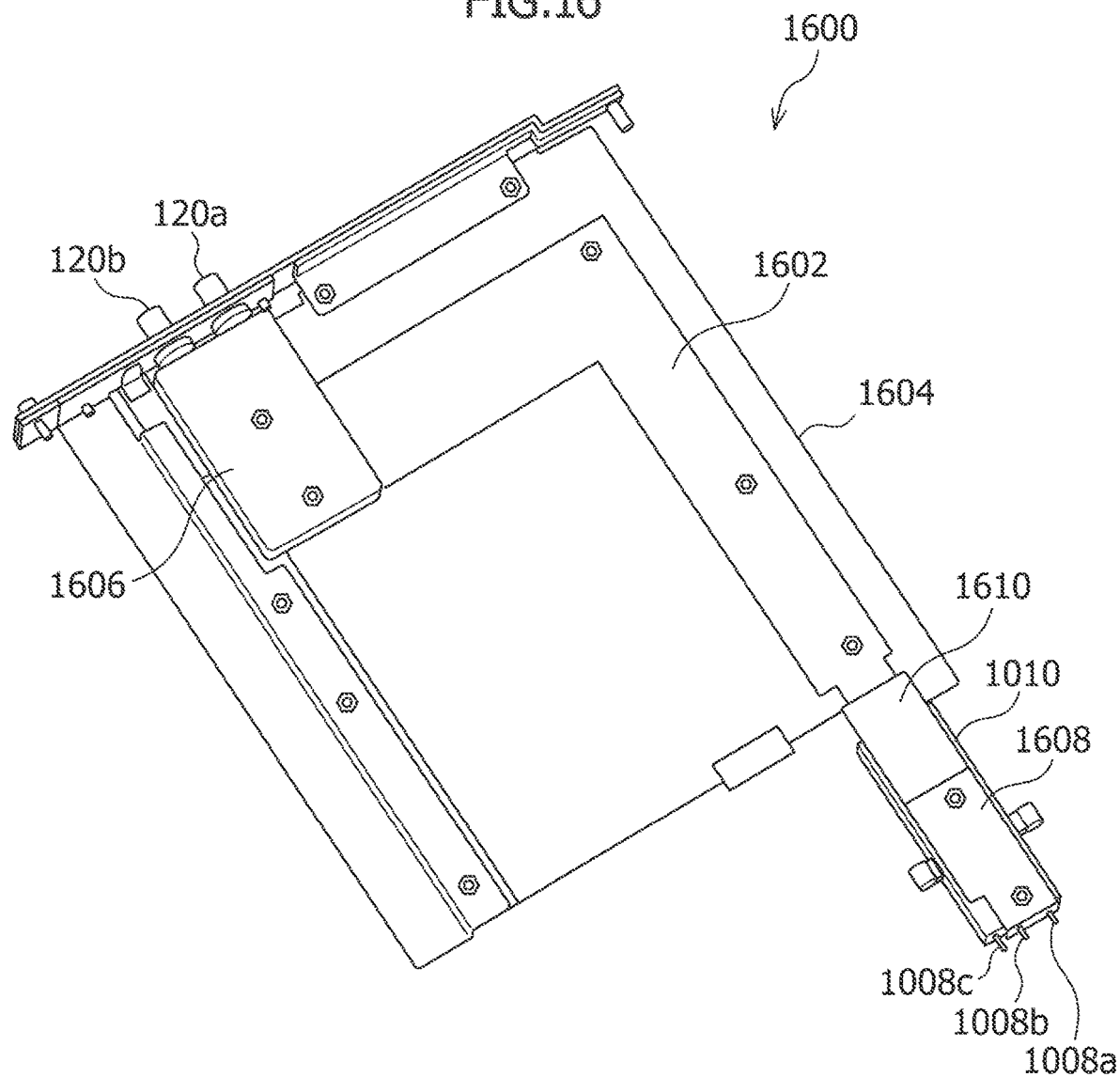

SEMICONDUCTOR WAFER TEST SYSTEM

BACKGROUND

Embodiments of the invention relate to a semiconductor test system configured to measure characteristics of a semiconductor, and more particularly, to a wafer test system to be connected to a wafer prober to test a device on a wafer.

In the semiconductor manufacturing industry, increases in wafer diameter and process miniaturization are progressing at a pace slower than in the past. It is becoming more difficult to maintain the economic efficiency of semiconductor manufacturing with existing logic/memory circuit manufacturing technologies. Moreover, integrated circuits (ICs) in the Internet of Things (IoT) and the automotive field, for example, in addition to ICs in the mobile/Personal Computer (PC)/server field, which have so far been the market driver, are now leading the market. The semiconductor manufacturing industry needs improved economic efficiency and diverse functions to keep up with market demands.

Examples of the improvement in economic efficiency include improvement in speed and power consumption with the use of light, improvement in density by three-dimensional packaging, and improvement in speed and density with the use of a magnetic substance or other new materials. Examples of the diverse functions include reduction in size and price by the integration of a radio frequency (RF) circuit and a power management circuit into a signal processing block, and reduction in size and power consumption of a power circuit with the use of a low-loss material/process.

Similar demands are also increasing in the field of semiconductor parametric test systems, configured to measure parametric characteristics of a semiconductor formed on an IC. Also, such demands apply to various wafer test systems configured to test a device on a wafer.

Thus, there is a need for wafer test systems to flexibly accommodate wafer tests that use measurement instruments that are not implemented in the test system at the initial development.

FIG. 17 is a block diagram of a conventional wafer parametric test system. An example of such a wafer parametric test system is Keysight 4080 Series of Parametric Testers, available from Keysight Technologies, Inc. FIG. 18 is a schematic diagram of a conventional test head circuit, such as Keysight 4082A Parametric Test System, also available from Keysight Technologies, Inc.

As shown in FIG. 17, a system cabinet is installed beside a wafer prober, and a test head is installed on the wafer prober. Among measurement resources, measurement instruments are mounted in the system cabinet. Also, measurement modules and switch modules (e.g., DC matrix, 8×10 RF matrix, HF matrix & pulse switch) are placed in dedicated slots in the test head. Measurement instrument inputs are connected to the test head by cables, and then wired inside the test head to be connected to the switch modules. Outputs from the measurement modules are wired inside the test head to be connected to the switch modules. Outputs of the switch modules are coupled to contact probes arranged to protrude from a lower surface of the test head for the external connection.

Further, a probe card is mounted to a bottom portion of the test head, and is connected to the wafer prober, to thereby construct an interface for transmission of signals from the contact probes to pads on a wafer via wafer needles on the probe card. In this manner, there is provided a device which enables transmission of various control signals and measurement signals from various measurement resources of a wafer parametric test system to a wafer prober and a wafer in the wafer prober.

As shown in FIG. 18, being a circuit diagram of circuits in a test head for the 4080 Series, measurement instruments other than the measurement modules are connected to external ports indicated by "8 AUX Ports." Thus, when a measurement instrument that is not implemented in the test system at initial development of the test system is to be connected to the test head for the 4080 Series, only a limited number of measurement instruments, that is eight at most, may be connected. The addition or expansion of a measurement function that is not supported by the conventional test systems accordingly requires alterations in terms of signal paths, control, and test head structure, and is therefore difficult, which makes it hard to flexibly meet requests for measurement of new characteristics.

Examples of the structure of the test head for the conventional parametric test systems described above are provided by U.S. Pat. No. 6,873,167 to Goto et al. (Mar. 29, 2005), and corresponding U.S. Patent Application Publication No. 2003/0082936 to Goto et al. (May 1, 2003), which are hereby incorporated by reference in their entireties.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2 is a view for illustrating a cabinet base, which is the skeletal structure of a cabinet in FIG. 1, according to a representative embodiment.

FIG. 3 is a schematic view for illustrating the structure of the cabinet in FIG. 1, according to a representative embodiment.

FIG. 5 is a left side view of the cabinet in FIG. 1 and an example of mounted instruments in which a left side panel is removed for illustration of the structure of the cabinet, according to a representative embodiment.

FIG. 6A is a sectional view for illustrating an air cooling structure of the cabinet with respect to one instrument, according to a representative embodiment.

FIG. 6B is a sectional view for illustrating another air cooling structure of the cabinet 102 with respect to an instrument, according to a representative embodiment.

FIG. 14 is a perspective view of the test head as viewed from the lower surface of the test head in which all pin modules are mounted, according to a representative embodiment.

FIG. 16 is a perspective view of a pin module, according to another representative embodiment.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various embodiments provide a wafer test system capable of flexibly adding a measurement instrument which is not implemented in the test system at the initial development.

Figure 1:
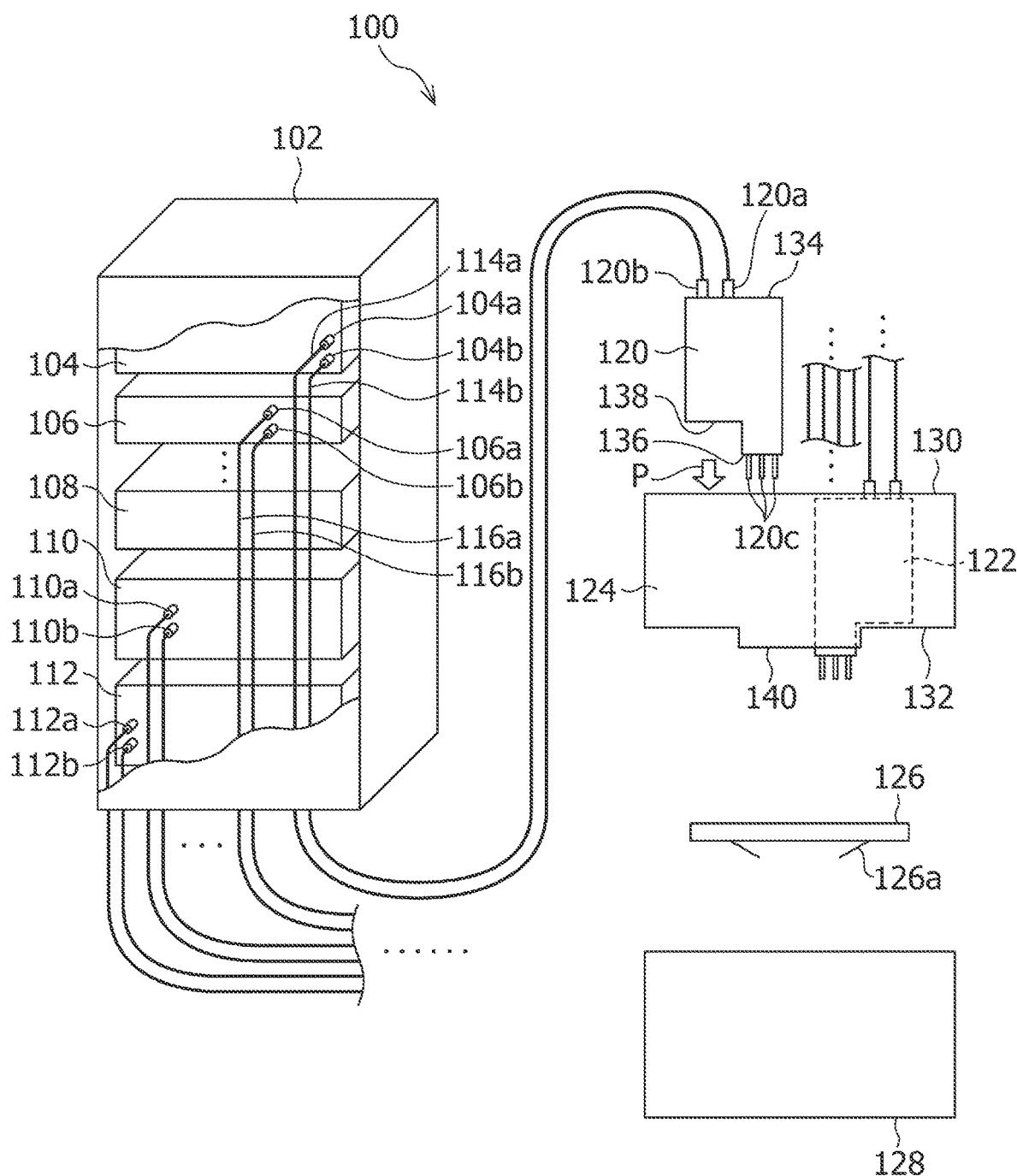
FIG. 1 is a simplified schematic view illustrating a structure of a wafer test system, according to a first representative embodiment.

FIG. 1 is a simplified schematic view illustrating a structure of a wafer test system, according to a first representative embodiment. Referring to FIG. 1, wafer test system 100 includes a cabinet 102 and a test head 124. A probe card 126 can be mounted to a lower surface 132 of the test head 124, and is further connected to a wafer prober 128 to perform measurement. Typically, at least one probe needle 126a is mounted to the probe card 126, and measurement is performed by bringing the tip of the probe needle 126a into contact (by a touchdown) with a signal terminal (a pad) of a device on a wafer, which is held in a movable manner inside the wafer prober 128.

As schematically illustrated in a partially transparent portion of FIG. 1, multiple instruments 104, 106, 108, 110, and 112 (collectively referred to as "instruments") are mounted in the cabinet 102. The instruments 104 to 112 may include a controller such as a computer, at least one single measurement instrument, and/or at least one measurement instrument with one or more measurement modules mounted therein. Typically, pairs of rails each having an L-shape in cross section and extending in the horizontal direction (not shown in FIG. 1) are provided in the cabinet 102 to form multiple layers arrayed in the top-bottom direction, and the instruments 104 to 112 are mounted on the rails. Only five layers of instruments are illustrated in FIG. 1, for purposes of illustration. However, the number of instruments to be mounted is not limited to five. More than five instruments or fewer than five instruments may be mounted, without departing from the scope of the present teachings. In some cases, excess space may be left as empty space.

In the depicted example, the instrument 108 may be a controller, so no signal connection terminal is provided on a front surface of the instrument 108. The other instruments 104, 106, 110, and 112 may be measurement instruments or measurement modules (which may be referred to as "measurement instruments"). Two connection terminals (104a and 104b, 106a and 106b, 110a and 110b, and 112a and 112b) are provided on respective front surfaces of the measurement instruments 104, 106 110 and 112, respectively, as schematically illustrated as an example. However, the number of connection terminals provided on each measurement instrument is not limited to two in various embodiments. Each connection terminal may be, but is not limited to, a coaxial connector or a triaxial connector, for example. Cables (114a and 114b, and 116a and 116b in the depicted example) compatible with the shape of the connection terminals provided in the instruments are connected to the connection terminals, so that the connection terminals can be connected to corresponding terminals of the test head 124.

The test head 124 is schematically illustrated as a partially transparent view, as viewed from the side. Multiple pin modules 120 and 122 are illustrated as representatives) are mounted to the test head 124. The pin module 120, which is representative of pin modules in a state before being mounted, is illustrated above an upper surface 130 side of the test head 124. As illustrated, connection terminals 120a and 120b configured to receive signals from a measurement instrument in the cabinet 102 are provided on an upper surface 134 side of the pin module 120, and in particular are connected to the measurement instrument 104 by the cables 114b and 114a, respectively. Three contact probes 120c are provided on a second lower surface 136 side of the pin module 120, and serve as terminals to which signals that correspond to signals input to the connection terminal 120a or 120b are output. Signals connectable to the connection terminals 120a and 120b are, for example, signals from a source measure unit's (SMU's) force terminal and sense terminal, which are connected to a triaxial cable with an active guard signal. Signals output to the three contact probes 120c can be the same force signal, sense signal, and guard potential signal that are input to the connection terminals 120a and 120b. However, the embodiments are not limited thereto, and the pin module 120 may employ a mode in which various signals from various measurement instruments are received and signals corresponding to the input signals are output in a contact probe format.

The guard potential mentioned above may be replaced by a common potential. Thus, the number of input connection terminals is not limited to two. The number of output contact probes is not limited to three as well. Further, the contact probe(s) are not limited to output pins, and may be implemented using different types of contacts, without departing from the scope of the present teachings.

Although illustration is partially omitted in FIG. 1, a cable from an associated measurement instrument 104, 106, 110 and 112 in the cabinet 102 is connected to each pin module mounted to the test head 124. The connection terminals of the pin modules and the connection terminals of the connected measurement instruments in the cabinet are associated with each other typically on a one-to-one basis, so that a pin module is provided for each channel of a measurement instrument. However, embodiments are not limited thereto. For instance, the cabinet 102 may house a measurement instrument that is not connected to a pin module.

The pin module 120 is inserted into the test head 124 in the direction of the arrow P. As indicated by the pin module 122, which is representative of pin modules in a state after being mounted, when the pin module 120 is mounted to the test head 124, the pin module 120 is housed such that a first lower surface 138 of the pin module 120 reaches the lower surface 132 of the test head 124 and an upper surface 134 of the pin module 120 is substantially flush with the upper surface 130 of the test head 124. When the pin module 120 is mounted to the test head 124, the second lower surface 136 of the pin module 120 is arranged so as to protrude by a given length from a cylindrical opening 140 on the lower surface 132 of the test head 124. Such arrangement takes into consideration the shape of the wafer prober 128 in which the probe card 126 is loaded at a position lower than a top plate of the wafer prober 128.

Each of the pin modules 120 and 122 is configured to receive an input through a cable from one of the measurement instruments 104, 106, 110 or 112, respectively, mounted in the cabinet 102, and a signal corresponding to the input is output to the probe card 126. The input and output are directly coupled inside on a channel-by-channel basis.

With the pin modules 120 and 122 having such structure, the wafer test system 100 according to the present embodiment may accommodate a measurement instrument unintended for the wafer test system 100 at the time of its design by mounting the measurement instrument in the cabinet 102 and by providing, for each channel, a pin module 120, 122, in which a connection terminal 120a, 120b receives a signal from the measurement instrument as a connection terminal compatible with a connector shape of the measurement instrument, even when the connector shape is unique to that measurement instrument. The received signal is converted into a contact probe format of the contact probes 120c to be output to the probe card 126.

The embodiment also addresses poor cooling efficiency for the instruments 104, 106, 108, 110 and 112 in the cabinet 102, and provides the cabinet 102 with a structure capable of improving an inlet and an outlet, which are associated with each instrument 104, 106, 108, 110 and 112, and the cooling efficiency for the interior of the cabinet 102, discussed below. An instrument that generates a large amount of heat, which cannot be placed in a conventional cabinet in view of the poor cooling efficiency, may be mounted in the cabinet 102 and deliver its designed performance.

With reference to FIG. 2 to FIG. 8, the structure of the cabinet is described according to a representative embodiment, having improved cooling efficiency over conventional cabinets. The cabinet 102 in FIG. 1 includes, as its frame, a cabinet base 200 illustrated in FIG. 2.

In the following description, it is understood that the same components as in different drawings are denoted by the same reference symbols, unless specifically stated otherwise. In FIG. 2 to FIG. 16 and FIG. 19, for easy understanding, illustrations of cables connected between the measurement instruments and the pin modules of the test head are omitted.

FIG. 2 is a view for illustrating a cabinet base 200, which is the skeletal structure of the cabinet 102 in FIG. 1, according to a representative embodiment. The cabinet base 200 is the main skeletal structure of the cabinet 102 in which L-shaped pillars 202, 204, 206, and 208 provided upright at the four corners of a quadrangular bottom unit 212 are joined to a ceiling unit 210. The ceiling unit 210 is longer than the bottom unit 212 in one direction (overhang) Levelers/stoppers 214a, 214b, 214c, and 214d are provided at the four corners of a back surface of the bottom unit 212 (the leveler/stopper 214d is not illustrated in FIG. 2). The levelers/stoppers 214a, 214b, 214c, and 214d at the four corners of the back surface of the bottom unit 212 can be neighbored by wheel casters 504a, 504b, 504c, and 504d as illustrated in detail in FIG. 5 to enable movement of the cabinet 102. However, for simplicity of description, the wheel casters are not illustrated in FIG. 2 to FIG. 4. The bottom unit 212 includes an upper surface 212a.

FIG. 3 is a schematic view further illustrating the structure of the cabinet 102 in FIG. 1, according to a representative embodiment. Referring to FIG. 3, the cabinet 102 is constructed as follows. Panels are fixed to the cabinet base 200 to surround the left side, the right side, and the top. Front doors and a rear door, which are openable and closable, are provided in the front and the rear of the cabinet base 200. Although only a left side panel 310b is illustrated in FIG. 3, right and left side panels 310a and 310b on the right and left sides, respectively, have vertically elongated openings 316a and 316b (the opening 316b is illustrated in FIG. 3), respectively. Air inlet panels and shutout blank panels are arranged in the openings of the right and left side panels 310a and 310b depending on the instruments to be mounted, as described below.

A rear door 312 is mounted to a rear portion of the cabinet 102 so as to be openable and closable about the longitudinal side of the left rear portion of the cabinet 102. However, the rear door is not limited thereto. An air exhaust unit 320, which includes an air exhaust fan and other components (not shown), is mounted to an inner lower portion of the rear door 312 and protrudes toward the interior of the cabinet 102. The air exhaust unit 320 is configured to exhaust the air in the cabinet 102, e.g., installed in a cleanroom, to a space behind and below the cabinet.

Three front doors 304, 306, and 308 are mounted to a front portion of the cabinet 102 so as to be openable and closable. The front door 304 and the front door 308 are mounted so as to openable and closable about the longitudinal side of the left front portion of the cabinet 102, although configurations of the front doors 304 and 308 are not limited thereto. A keyboard may be provided behind the front door 306, which may be configured to open downward by pulling an upper side of the front door 306 to allow the front door 306 to turn about a lower side of the front door 306. A top panel 302 is mounted to an upper portion of the cabinet 102. The top panel 302 includes a mesh-like area 314, or may have multiple minute holes (air holes) to function as a vent.

The front doors 304, 306, and 308 are openable and closable so as to allow measurement instruments and other instruments to be placed into the cabinet 102 from the front. The rear door 312 is openable and closable so as to allow mounting of a cable of a power source or the like, as well as maintenance from the rear. The cabinet size may be, for example, 600 mm (width)×1,040 mm (depth)×2,026 mm (height), although the dimensions may vary to provide unique benefits for any particular situation or to meet application specific design requirements of various implementations, as would be apparent to one skilled in the art.

Figure 4:
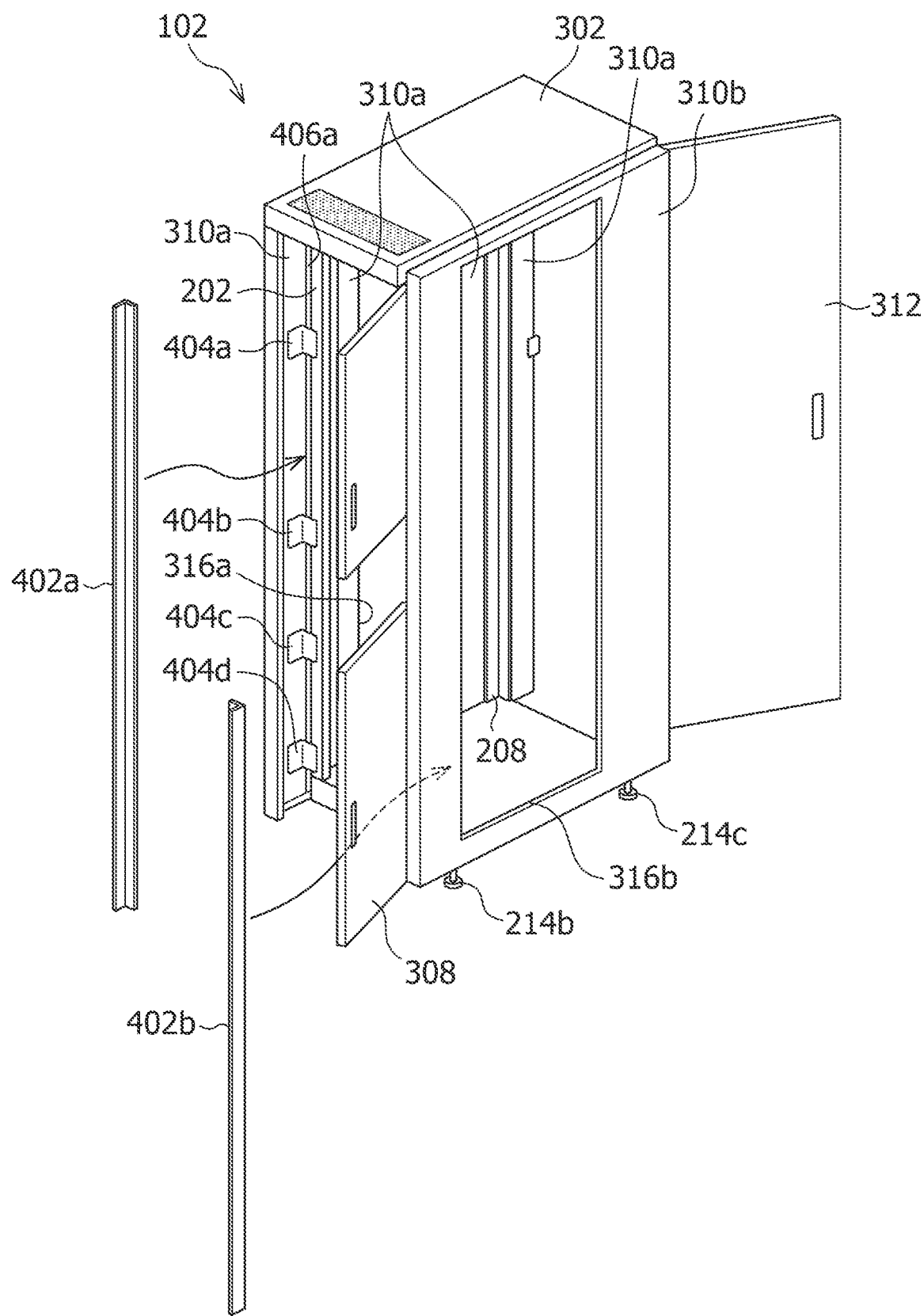
FIG. 4 is a schematic view for illustrating the structure of the cabinet in FIG. 3, according to a representative embodiment.

FIG. 4 is a schematic view for illustrating the structure of the cabinet 102 in FIG. 3, according to a representative embodiment. Referring to FIG. 4, it is understood that some of the cabinet doors are opened and front portion partition boards are installed for enhancing the cooling effect for the interior of the cabinet. The rear door 312 can be opened as illustrated in FIG. 4. The front doors 304 and 308 may also be opened as illustrated in FIG. 4. The front door 306 is not shown in FIG. 4 for ease of illustration.

In FIG. 4, the right front pillar 202 of the cabinet base 200, the back side of the right side panel 310a, and the opening 316a of the right side panel 310a are illustrated. The right side panel 310a is mounted to the right front pillar 202 by metal fittings 404a, 404b, 404c and 404d, with a gap 406a defined between the right front pillar 202 and the right side panel 310a. Although not illustrated in FIG. 4, a similar gap 406b is defined between the left front pillar 204 of the cabinet base 200 and the left side panel 310b. Vertically elongated and L-shaped front portion partition boards 402a and 402b are mounted as illustrated in FIG. 4 so as to close the gaps 406a and 406b.

The L-shaped front portion partition boards 402a and 402b are installed for the purpose of preventing the exhaust air in the rear-half portion of the interior of the cabinet 102 from returning to the front-half portion of the interior of the cabinet 102 (a space in front of the front surfaces of the instruments). The L-shaped front portion partition boards 402a and 402b are merely an example, and the front portion partition boards 402a and 402b may have shapes other than the L shape. Alternatively, the pillars 202, 204, 206, and 208 in FIG. 2 may be shaped so as to also serve as partition boards.

FIG. 5 is a left side view of the cabinet 102 in FIG. 1 and an example of mounted instruments in which a left side panel 310b is removed for illustration of the structure of the cabinet 102, according to a representative embodiment.

Referring to FIG. 5, an example is given of a state in which various instruments are mounted in the cabinet 102.

In FIG. 5, a liquid crystal display 502 of the controller is mounted between the front door 304 and the front door 306 so that a height and an angle thereof are adjustable. The liquid crystal display 502 is not shown in other drawings for ease of illustration.

In FIG. 5, there are illustrated a first-layer rail 510, a second-layer rail 512, a third-layer rail 514, a fourth-layer rail 516, a fifth-layer rail 518, a sixth-layer rail 520, a seventh-layer rail 524, an eighth-layer rail 526, a ninth-layer rail 528, and a tenth-layer rail 530 between the left front pillar 204 and left rear pillar 206 of the cabinet base 200. In the depicted view, the illustrated first-layer to tenth-layer rails 510 to 530 are left rails of pairs of right and left rails, each having an L-shape in cross section, on which instruments are mounted in multiple layers in the top-bottom direction.

Next, description is given of the instruments of the respective layers placed on the rails of the respective layers. An instrument 550 of the first layer is mounted on the first-layer rails (e.g., first-layer rail 510), and is a power source unit (power distribution unit: PDU), for example, for the entire test system, according to the present embodiment.

An instrument 548 of the second layer and an instrument 546 of the third layer are mounted on the second-layer rails (e.g., second-layer rail 512) and the third-layer rails (e.g., third-layer rail 514), respectively, and are chassis-type measurement instruments, for example, in which measurement modules are housed. Each of the instruments 548 and 546 may be an AXie chassis, for example, such as a M9505A provided by Keysight Technologies, Inc., for example.

An instrument 544 of the fourth layer is mounted on the fourth-layer rails (e.g., fourth-layer rail 516), and is a switching unit, for example, for switching between measurement instruments. An instrument 542 of the fifth layer is mounted on the fifth-layer rails (e.g., fifth-layer rail 518), and is the controller, for example, configured to perform overall control of the test system according to the present embodiment. Generally, the controller may be implemented by one or more computer processors, field-programmable gate arrays (FPGAs), application specific integrated circuits (ASICs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. General-purpose computers, dedicated controllers, and various other instruments in which a computer is installed may be used as the controller. Examples of the dedicated controllers include various personal computers (PCs) on which Linux (trademark) is installed as the operating system (OS). Other dedicated controllers that may be used are various personal computers (PCs) in which a Windows (trademark) series OS, a product of Microsoft (trademark) Corporation, is installed, and/or FPGA elements on which an OS is installed.

An instrument 540 of the sixth layer and an instrument 538 of the seventh layer are mounted on the sixth-layer rails (e.g., sixth-layer rail 520) and the seventh-layer rails (e.g., seventh-layer rail 524), respectively, and are each a source measure unit (SMU), for example, configured to perform high-quality supply and measurement of a current and a voltage. An example of the SMU is B2912A manufactured by Keysight Technologies, Inc.

An instrument 536 of the eighth layer is mounted on the eighth-layer rails (e.g., eighth-layer rail 526), and is an LCR meter, for example, configured to measure various types of impedance. An example of the LCR meter is E4980A manufactured by Keysight Technologies, Inc. LCR meters may also be referred to as impedance meters.

An instrument 534 of the ninth layer is mounted on the ninth-layer rails (e.g., ninth-layer rail 528), and is a digital volt meter (DVM), for example, configured to measure a voltage and a current. An example of the DVM is 34470A manufactured by Keysight Technologies, Inc.

An instrument 532 of the tenth layer is mounted on the tenth-layer rails (e.g., tenth-layer rail 530), and may be an additional measurement instrument, for example, such as a N7745A Optical Multiport Power Meter manufactured by Keysight Technologies, Inc., for example. When the instrument 532 is N7745A Optical Multiport Power Meter, an optical cable (optical fiber) is connected to a connection terminal of the N7745A Optical Multiport Power Meter to connect directly to a device under test (DUT) on a wafer through a hole in a cylinder 908, which has a hollow portion and is at the center of a test head 124 described below with reference to FIG. 9A.

The wheel casters 504b and 504c are illustrated in FIG. 5 on the back surface of the bottom unit 212 of the cabinet base 200 in addition to the levelers/stoppers 214b and 214c. While the wheel casters are provided at the four corners of the back surface of the bottom unit 212, only the wheel casters 504b and 504c in the left front and left rear portions of the cabinet are illustrated in FIG. 5. The wheel casters are not illustrated in other drawings for ease of illustration.

In FIG. 5, the back side of the right side panel 310a of the cabinet 102 is illustrated. Although not illustrated in FIG. 5, air intake panels are mounted in the opening 316a of the right side panel and the opening 316b of the left side panel at positions corresponding to air inlet positions of the mounted instruments, as described below. Blank panels are mounted at other positions to block ventilation to and from the outside.

In FIG. 5, there is also illustrated the front portion partition board 402b, which is mounted to the left front portion on the inside of the cabinet 102. In FIG. 5, the space above the instrument 532 in the cabinet is empty. However, additional rails may be installed in this space to mount an additional measurement instrument or a different type of instrument, in various configurations.

Figure 19:
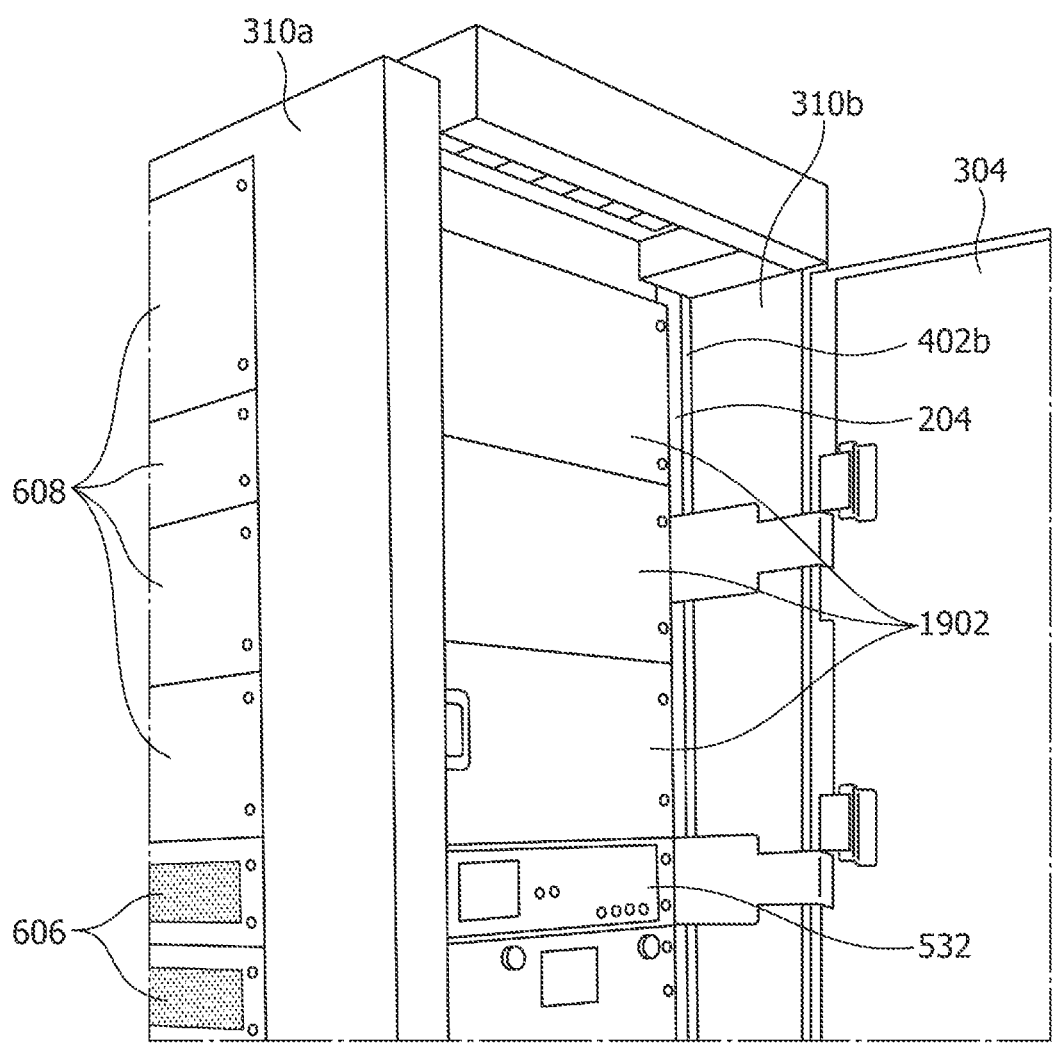
FIG. 19 is a perspective view of a part of the cabinet with a front door opened for illustration of separation panels, which are installed in a space above an instrument, according to a representative embodiment.

In spaces inside the cabinet in which no instrument is mounted, such as the space above the instrument 532, for example, at least one separation panel 1902 as illustrated in FIG. 19 is installed between the right front pillar 202 and left front pillar 204 of the cabinet 102. FIG. 19 is a perspective view of a part of the cabinet 102 with a front door 304 opened for illustration of the separation panels 1902, which are installed in the space above the instrument 532 in FIG. 5, according to a representative embodiment. Each separation panel 1902 is a component required for separation of a front portion space and rear portion space relevant to air intake and air exhaust in the cabinet 102 in such cases. In other words, when the interior of the cabinet 102 has a layer on which no instrument is mounted, the separation of an air intake space and an air exhaust space in the cabinet 102 may not function effectively without the separation panel 1902, as described below.

The separation panel 1902 is applicable not only to an upper space in the cabinet 102 in which no instrument is mounted, and is applicable as a separation panel of a size suitable for the separation of a front portion space and rear portion space relevant to air intake and air exhaust in the cabinet 102 in a central or lower space in the cabinet 102 in which no instrument is mounted. Air intake panel 606 and blank panel 608 are further described below with reference to FIG. 19.

FIG. 6A is a sectional view for illustrating an air cooling structure of the cabinet 102 with respect to one instrument, and FIG. 6B is a sectional view for illustrating another air cooling structure of the cabinet 102 with respect to an instrument, according to representative embodiments. Thus, description of an air cooling structure of the cabinet 102 in the test system is provided referring to FIG. 6A and FIG. 6B.

As a rule of thumb derived from observation of rack-mountable measurement instruments or rack-mountable controllers and other instruments in circulation, all instruments similar to the instruments 532 to 550 mounted in FIG. 5 have an air inlet or an air outlet for cooling at one of the following positions. That is, the air inlet for cooling is on the front surface of the instrument, or on the left side surface and/or right side surface of the instrument. The air outlet for cooling, on the other hand, is on the rear surface of the instrument, or on one of the left side surface and the right side surface of the instrument having no air inlet.

Accordingly, the following eight cases are examined to consider cooling in the cabinet. (1) The air inlet is on the right side surface, and the air outlet is on the left side surface. (2) The air inlet is on the right side surface, and the air outlet is on the rear surface. (3) The air inlet is on the left side surface, and the air outlet is on the right side surface. (4) The air inlet is on the left side surface, and the air outlet is on the rear surface. (5) The air inlet is on each of the left side surface and the right side surface, and the air outlet is on the rear surface. (6) The air inlet is on the front surface, and the air outlet is on the left side surface. (7) The air inlet is on the front surface, and the air outlet is on the right side surface. (8) The air inlet is on the front surface, and the air outlet is on the rear surface.

FIG. 6A is a sectional view of the cabinet cut horizontally at the midpoint of the height of a mounted instrument as viewed from above in Case 1 or Case 2. A panel 620 in FIG. 6A corresponds to one of the front doors 304, 306, and 308 of the cabinet. A portion including the panel 620 is the front portion of the cabinet, and a portion including the rear door 312 is the rear portion of the cabinet. The front portion partition board 402a having an L shape is installed in front of the right front pillar 202 of the cabinet base, and the front portion partition board 402b is similarly installed in front of the left front pillar 204. An instrument 602 is installed on a pair of rails 604a and 604b. A rear end line 626 of the upper surface 212a of the bottom unit 212 of the cabinet base 200 is shown.

In Case 1, air is taken into the instrument 602 as indicated by the arrow A, and is exhausted from the instrument 602 as indicated by the arrow B. To accomplish this with a high cooling effect, an air intake panel 606 is installed in a portion of the opening 316a in the right side panel 310a of the cabinet at a height corresponding to the position of the instrument 602. The air intake panel 606 includes an air intake guide 622, which is tubular as described below, and this tubular portion is illustrated in cross section in FIG. 6A in two places. A surface of the air intake panel 606 is shaped like a mesh or has multiple minute holes (air holes) to take the outside air into the cabinet as described below. A blank panel 608 configured to block ventilation to and from the outside is installed in a portion of the opening 316b in the left side panel 310b of the cabinet at a height corresponding to the position of the instrument 602, near the air outlet on the left side surface of the instrument 602. As described below, the blank panel 608 may simply be a flat board without an opening, and covers a position of the opening 316*b* at a height corresponding to the position of the instrument 602. The blank panel 608 is installed so that, when an instrument other than the instrument 602 is mounted on one of the layers of the cabinet in the mode of Case 3 or Case 4, degradation in cooling efficiency due to the mixing of the exhaust air of the instrument 602 with the outside air taken into that instrument is prevented.

Another purpose of the blank panel 608 is to prevent the exhaust air of the instrument 602 from leaking from the side of the cabinet and being taken into another instrument through an air intake panel of the instrument. This is because a cleanroom in which the test system is installed to conduct a wafer test is generally structured so that air is taken in from the floor surface and exhausted to the outside of the clean room. This demands that the exhaust air of the test system be a downflow all the time and demands the prevention of the mixing of the exhaust air with the intake air as well.

The blank panel 608 may also be used to guide the exhaust air of the instrument 602 toward the rear of the interior of the cabinet by making the exhaust air bump against the blank panel 608. With the L-shaped front portion partition board 402*b* installed in the front portion of the interior of the cabinet as described above, the exhaust air of the instrument 602 flows only toward the rear of the interior of the cabinet. The exhaust air can accordingly be guided to the rear.

In other words, in Case 1, the air in a space X in a portion of the interior of the cabinet in front of the front surface of the instrument 602 in FIG. 6A is separated from the instrument 602 and does not participate in the cooling of the instrument 602.

A space Y next to the right side surface of the instrument 602 on which the air inlet is located functions as a path along the arrow A for the air taken in from the outside of the cabinet by a tubular air intake guide 622 of the air intake panel 606, and is separated from the air in spaces in front of, to the left, and behind the instrument 602.

A space next to the left side surface of the instrument 602 on which the air outlet is located communicates to a space in the cabinet behind and outside the instrument 602 to form a space Z, and further, the air in this space is exhausted to the outside behind and below the cabinet by the air exhaust unit 320, which is located in an inner lower portion of the rear door 312 in the rear portion of the cabinet as illustrated in FIG. 3. Consequently, the air in this space is sufficiently separated from the air near the air inlet of the instrument 602 and an air inlet of another instrument mounted in the cabinet, and does not affect the cooling of the instruments mounted in the cabinet. When the cabinet of the present invention is installed in a cleanroom in which an air outlet is often provided on the floor surface, the air exhausted to the outside of the cabinet may therefore be quickly exhausted to the outside of the cleanroom without being diffused.

In Case 2, air is exhausted from the rear of the instrument 602 in FIG. 6A as indicated by the arrow C. However, the air intake panel 606 installed in a portion of the opening 316*a* in the right side panel 310*a* of the cabinet at a height corresponding to the position of the instrument 602 and the blank panel 608 installed in a portion of the opening 316*b* in the left side panel 310*b* of the cabinet at a height corresponding to the position of the instrument 602 are the same as those in Case 1. In other words, in Case 2, exhaust air C from the instrument 602 in FIG. 6A is exhausted to the same space Z as in Case 1, and the same description that is given on Case 1 accordingly applies to the spaces X, Y, and Z.

Case 3 and Case 4 are understood by switching the left and right in the descriptions given above regarding Case 1 and Case 2 with reference to FIG. 6A. Detailed descriptions of Case 3 and Case 4 are therefore omitted.

In Case 5, the cabinet may be cooled efficiently by combining Case 2 and Case 4, and mounting the air intake panel 606 from the left, and another air intake panel symmetrical with the air intake panel 606 from the right, to each of a portion of the right side panel 310*a* of the cabinet and a portion of the left side panel 310*b* of the cabinet at a height corresponding to the position of the instrument 602.

Next, description is provided for Case 6 to Case 8 with reference to FIG. 6B. FIG. 6B is a sectional view similar to FIG. 6A, but an instrument 610 illustrated in FIG. 6B is an instrument in Case 6, 7, or 8, and takes in air from the space X in front of the instrument 610 in the direction of the arrow E. In Case 6, the air is exhausted from the left side surface of the instrument 610 as indicated by the arrow B. In Case 8, the air is exhausted from the rear surface of the instrument 610 as indicated by the arrow C. The blank panel 608 is mounted in each of a portion of the opening 316*a* in the right side panel 310*a* of the cabinet and a portion of the opening 316*b* in the left side panel 310*b* of the cabinet at a height corresponding to the position of the instrument 610. Each blank panel 608 prevents the exhaust air of the instrument 610 from mixing with the air outside the left or right side of the cabinet. When an instrument other than the instrument 610 is mounted in one of the layers of the cabinet in the mode of one of Case 1 to Case 5, degradation in cooling efficiency due to the mixing of the exhaust air of the instrument 610 with the outside air taken into that instrument may accordingly be avoided.

In Case 6, the instrument 610 takes in air from the space X in the cabinet in front of the front surface of the instrument 610 in the direction of the arrow E. The air in the space X may be outside air introduced through the mesh-like area 314, which is illustrated in FIG. 3 as an area in the top panel 302 of the cabinet. Note that the mesh-like area 314 is provided only in a place corresponding to the space X. In addition to the mesh-like area 314, an air inlet leading only to the space X to take in the air from below may be provided between a lower portion of the front door 306 and the front end of the bottom unit 212.

The intake air of the instrument 610 passes through the instrument 610, and is exhausted from the left side surface as indicated by the arrow B. The exhaust air is then exhausted to a space V, in which a space in the cabinet outside each of the left and right side surfaces of the instrument 610 communicates with a space in the cabinet behind and outside the instrument 610, and is further exhausted to the outside behind and below the cabinet by the air exhaust unit 320, which is located in an inner lower portion of the rear door 312 in the rear portion of the cabinet as illustrated in FIG. 3. Consequently, the exhaust air is sufficiently separated from the air near the air inlet of the instrument 610 and an air inlet of another instrument mounted in the cabinet.

Case 7 is understood by switching the left and the right in the description above regarding Case 6 with reference to FIG. 6B. A detailed description of Case 7 is therefore omitted.

In Case 8, air is exhausted from the rear of the instrument 610 in FIG. 6B as indicated by the arrow C. The blank panel 608 mounted in each of a portion of the opening 316*a* in the right side panel 310*a* of the cabinet and a portion of the opening 316b in the left side panel 310b of the cabinet at a height corresponding to the position of the instrument 610, is the same as the one in Case 6. Consequently, the exhaust air from the instrument 610 is sufficiently separated from the air near the air inlet of the instrument 610 and an air inlet of another instrument mounted in the cabinet in Case 8 as in Case 6.

Considering the space V in FIG. 6B and the space Z in FIG. 6A, it may be thought that the space Z in FIG. 6A extends also to a portion that is not surrounded by the air intake guide 622 of the air intake panel 606 in the space Y, though not illustrated in detail, in a shape similar to that of the space V in FIG. 6B.

Figure 7A:
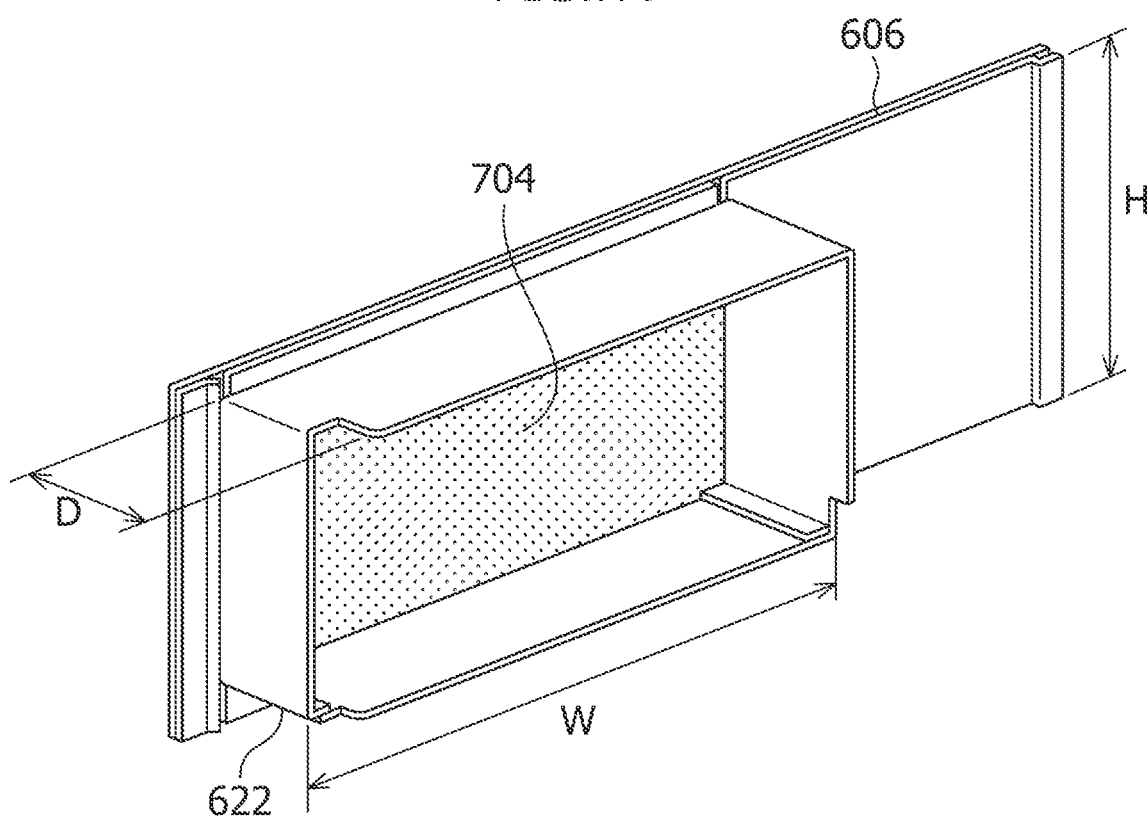
FIG. 7A is a perspective view of an air intake panel, which is mounted to a side surface of the cabinet, according to a representative embodiment.
Figure 7B:
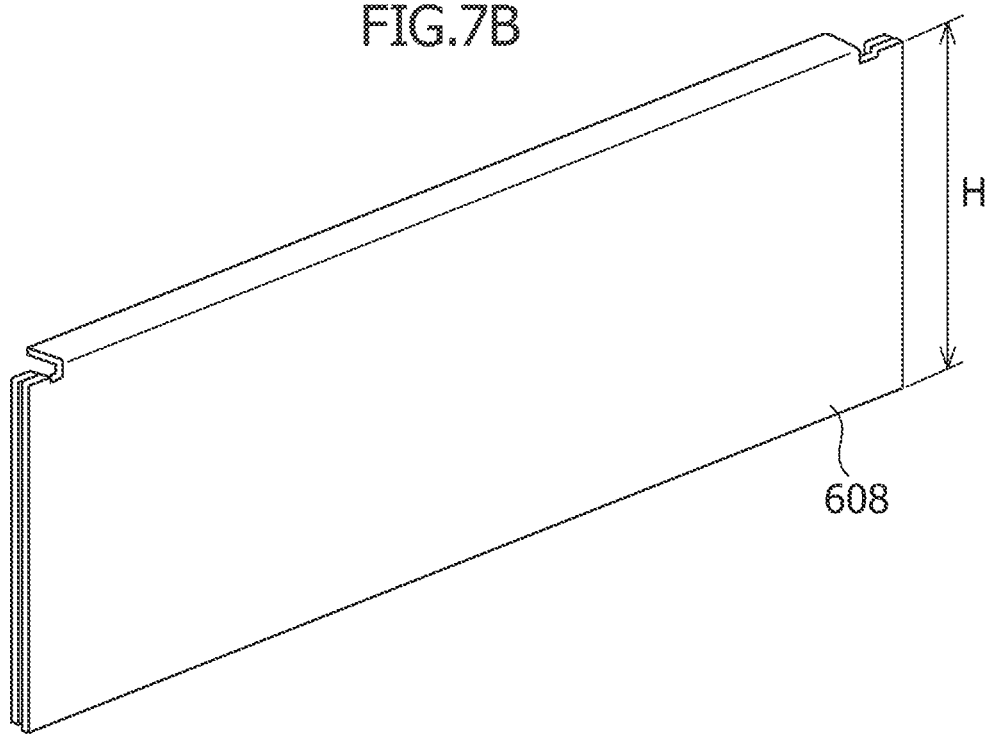
FIG. 7B is a perspective view of a blank panel, which is mounted to a side surface of the cabinet, according to a representative embodiment.

Next, description is provided of the air intake panel 606 and blank panel 608 illustrated in FIG. 6A and FIG. 6B with reference to FIG. 7A and FIG. 7B. FIG. 7A is a perspective view of an air intake panel, which is mounted to a side surface of the cabinet 102, and FIG. 7B is a perspective view of a blank panel, which is mounted to a side surface of the cabinet 102, according to a representative embodiments.

FIG. 7A is a view for illustrating the air intake panel 606, which is mounted to a side of the cabinet. An air inlet 704 through which air is taken in from the outside of an air exhaust panel is shaped like a mesh or has multiple minute holes (air holes). The tubular air intake guide extends from the air inlet 704 to an air inlet of the instrument. The air inlet 704 in FIG. 7A is a rectangle having a width W and a height H. The air intake guide 622, which is a tube having a length D, is also a rectangle having the width W and the height H in cross section. An end portion of the air intake guide 622 that is opposite from the air intake panel 606 is desirably in contact with a side surface of the instrument on which an air inlet is located, or is close enough to the side surface of the instrument to make an inflow of the air from a space inside the cabinet ignorable. The height H is desirably substantially equal to the height of the instrument relevant to air intake, but it is not limited thereto.

When the width of an instrument mounted in the cabinet is smaller than a width between the pillars of the cabinet, and the gap between the end portion of the air intake guide 622 of the air intake panel 606 and an air inlet of the mounted instrument consequently presents a problem in separating the front portion space and rear portion space relevant to air intake and air exhaust in the cabinet as described with reference to FIG. 19, a mechanism may be provided to extend the air intake guide 622 at the tip of the air intake guide 622 of the air intake panel 606. The mechanism is shaped so that the front portion space and rear portion space relevant to air exhaust and air intake in the cabinet are separated.

Alternatively, the air intake panel 606 in the case described above may include a separation panel capable of extending farther the length D of the air intake guide 622. The separation panel is further capable of separating the front portion space and rear portion space relevant to air exhaustion and air intake in the cabinet.

The shape of the air inlet 704 and the air intake guide 622 in cross section may match the shape of the air inlet of the instrument, or may be larger than the air inlet shape of the instrument. This shape in cross section may also be smaller than the air inlet shape of the instrument and, in this case, modifications are required to prevent the mixing of the air taken into the instrument from the outside of the air intake guide with the air exhausted from the instrument. However, such modifications are within the scope of the present teachings.

FIG. 7B is an illustration of the blank panel 608. The blank panel 608 desirably has a height H substantially equal to the height of an instrument relevant to the installation of the blank panel 608, although the height H of the blank panel 608 is not limited thereto. The blank panel 608 may have various shapes as long as the blank panel 608 is capable of preventing the mixing of the air inside the cabinet and the air outside the cabinet.

Therefore, in a space above the instrument 532 inside the cabinet, a separation panel (not shown) is provided between the right and left front pillars 202 and 204 in a space in front of and above the front surface position of the instrument 532 in which no instrument is mounted as described above with reference to FIG. 5 and FIG. 19, in order to separate the space X from other spaces in FIG. 6A and FIG. 6B.

Figure 8:
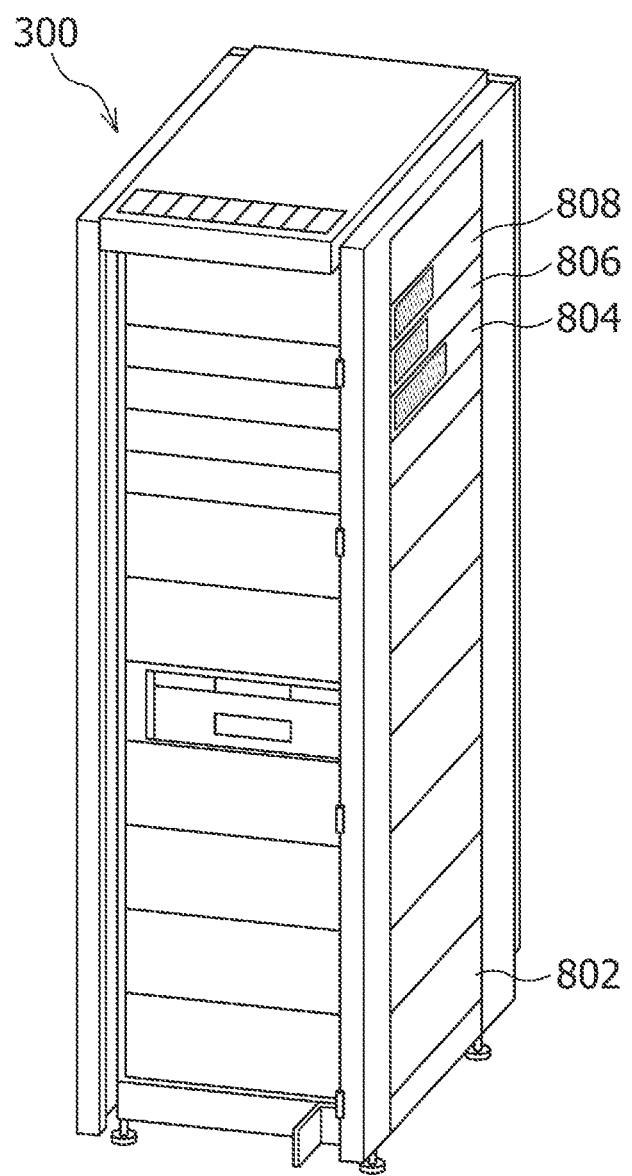
FIG. 8 is a perspective view for schematically illustrating the exterior of the cabinet with air intake panels and blank panels mounted to a side surface of the cabinet, according to a representative embodiment.

FIG. 8 is a perspective view for schematically illustrating the exterior of a cabinet with air intake panels and blank panels mounted to a side surface of the cabinet, according to a representative embodiment. That is, FIG. 8 illustrates how the exterior of cabinet 300 (substantially similar to cabinet 102) appears after instruments are mounted therein. In the opening 316b in the left side panel of the cabinet 300, air intake panels 804, 806, and 808 are mounted at positions corresponding to the instruments 532, 534, and 536 in the cabinet 102 as shown in FIG. 5, each of which has an air inlet on the left side. The opening 316b also has a number of blank panels 802 other than the air intake panels 804, 806, and 808. The front doors 304, 306, and 308 and liquid crystal display 502 as shown in FIG. 5 are not shown in the cabinet 300 illustrated in FIG. 8 to facilitate understanding.

In other words, the cabinet (102, 300) of the first representative embodiment may be configured so that the cabinet includes at least one front door (304, 306, 308), a left side panel (310b), a right side panel (310a), a rear door (312), a ceiling unit (210), and a bottom unit (212), and is configured to house multiple instruments (104, 106, 108, 110, 112). Each of the instruments in the cabinet has a front surface, a left side surface, a right side surface, and a rear surface, and some of the measurement instruments each include at least one first connection terminal (104a, 104b, 106a, 106b, 110a, 110b, 112a, 112b).

The cabinet (102, 300) may further include a first space (X) defined in the cabinet between the at least one front door and the front surface of each of the instruments, and a second space (Z) defined in the cabinet between the rear door and the front surface of each of the instruments. The cabinet has a configuration in which the first space and the second space are separated in the cabinet to separate intake air and exhaust air of the instruments in the cabinet.

When some of the instruments have air inlets on left side surfaces and/or right side surfaces thereof, the cabinet includes air intake panels (606) on the left side surface and/or the right side surface of the cabinet corresponding to the air inlets. The air intake panels each include a tubular air intake guide (622), which extends from the relevant air inlet and pierces through the left side surface and/or the right side surface of the cabinet corresponding to the relevant air inlet. The cabinet includes a blank panel (608) as a first separation panel, which separates air inside the cabinet and air outside the cabinet, for left side surfaces and/or right side surfaces of some of the instruments for which no air inlets are provided.

The configuration of separating the first space and the second space in the cabinet may include multiple second separation panels (402a, 402b), which cover gaps between left and right edges of the front surfaces of the instruments and left and right side surfaces of the cabinet. The configuration of separating the first space and the second space in the cabinet may include a third separation panel, which covers from an upper edge of the front surface of at least one of the instruments to the ceiling unit of the cabinet, and/or a fourth separation panel, which covers from a lower edge of the front surface of at least another of the instruments to the bottom unit of the cabinet. The configuration of separating the first space and the second space in the cabinet may include a fifth separation panel, which covers from a lower edge of the front surface of one of the instruments to an upper edge of the front surface of another of the plurality of instruments.

With the configuration of the cabinet described above, the cooling system of the cabinet according to the representative embodiment of the invention may perform separately, for each of multiple different instruments housed in the cabinet (e.g., measurement instruments), air intake suited to a corresponding air intake system of the instrument. In addition, the intake air and exhaust air of each instrument are separated to avoid mixture, which enables the instrument to take in air having a temperature close to room temperature despite being inside the cabinet. With each instrument having the independent air intake structure, limitations on the maximum allowable heat capacity for the cabinet, which has been a problem with respect to conventional cabinets, are lifted, and every instrument housed in the cabinet can be cooled in a suitable state envisioned for the instrument at the time of designing of each instrument. This enables the instrument to deliver its designed performance.

In other words, the structure described above allows the cabinet to stack multiple measurement instruments and other instruments having different cooling structures in a manner limiting in the cabinet height direction, without needing to conform to power consumption limitations. An appropriate cooling effect is also obtained for each of the instruments regardless of the position in the cabinet height direction in which the instrument is placed. Accordingly, a new measurement instrument required to be installed in the cabinet, e.g., by a request for the new measurement, may be flexibly added to the interior of the cabinet even though the cabinet was not designed specifically to the specifications of new instrument, which is advantageous.

Next, with reference to FIG. 9A and FIG. 9B to FIG. 15A and FIG. 15B, description is given of a test head structure and a pin module structure in a representative embodiment.

Figure 9A:
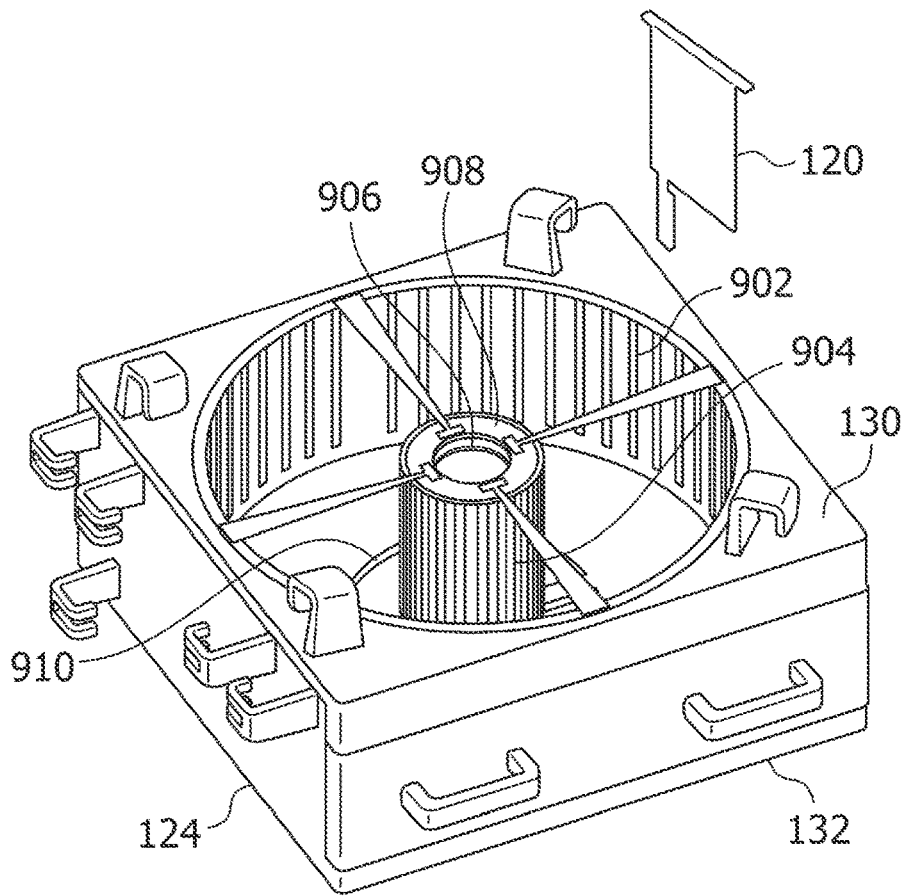
FIG. 9A is a perspective view of a test head in a blank state as viewed in the direction of an upper surface in order to illustrate the structure of the test head, according to a representative embodiment.
Figure 9B:
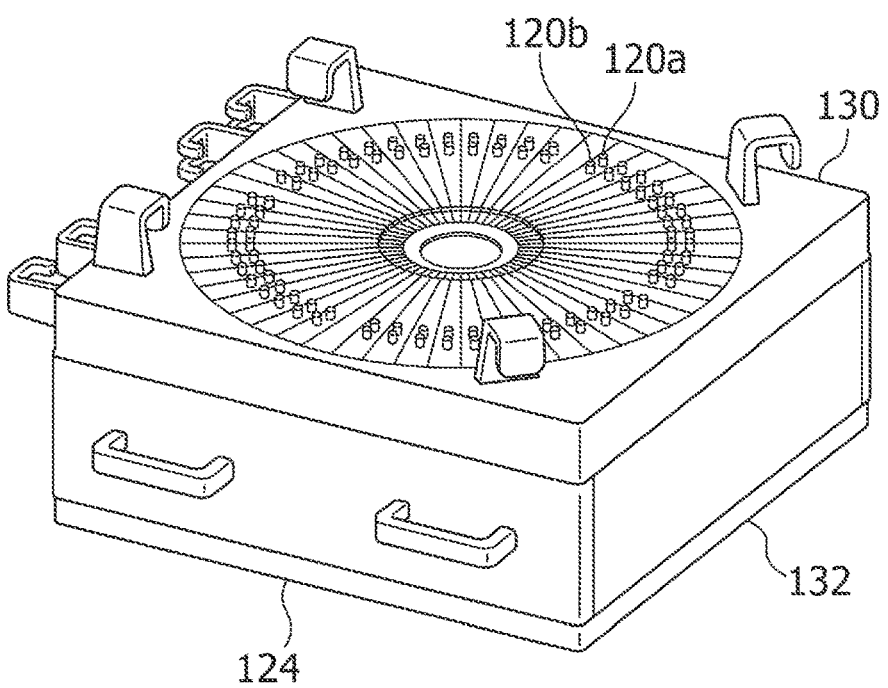
FIG. 9B is a perspective view of the test head as viewed in the direction of the upper surface in which all pin modules are mounted in order to illustrate the structure of the test head, according to a representative embodiment.

FIG. 9A is a perspective view of a test head 124 in a blank state as viewed in the direction of an upper surface 130 of the test head 124 in order to illustrate the structure of the test head 124, and FIG. 9B is a perspective view of the test head 124 as viewed in the direction of the upper surface 130 in which all pin modules are mounted in order to illustrate the structure of the test head 124, according to representative embodiments.

FIG. 9A is a view for illustrating the test head 124 in a blank state for easier understanding of the test head structure. The pin module 120 prior to the insertion into the test head 124 is illustrated above and to the right of the test head 124. The test head 124 has the upper surface 130 and the lower surface 132, and the pin module 120 is mounted by inserting the pin module 120 from the same side as the upper surface 130. The cylinder 908 having a hollow portion is included at the center of the inside of the test head 124, and inner guide rails 904 are provided on the outer circumference of the cylinder 908. Outer guide rails 902 are provided in a concentric cylindrical pattern so as to further surround the cylinder 908.

The pin module 120 is inserted into a slot formed by a pair of one inner guide rail 904 and one outer guide rail 902 to be mounted in a radial pattern around the cylinder 908. As described below, a substantially donut-shaped opening 910 is formed around a portion of the lower surface 132 of the test head in which the cylinder 908 is in contact with the lower surface 132. A pogo block 1010 (illustrated in FIG. 11) to which the contact probes 120c (illustrated in FIG. 1) of the pin module 120 are mounted is mounted so that tip of the pogo block 1010 protrudes from the lower surface 132. As many slot interlock switches 906 as the number of inner guide rails 904 are arranged in a ring pattern on the inner side of the cylinder 908 on the upper surface 130 side as described below. When a pin module 120 is set in each slot as described below, a corresponding switch out of slot interlock switches 906 is depressed.

FIG. 9B is a view for illustrating the test head 124 with a maximum number of pin modules 120 mounted thereto. In FIG. 9B, the connection terminals 120a and 120b of the pin modules 120 are arranged in a concentric pattern on the upper surface 130 of the test head 124. The maximum number of pin modules 120 that can be mounted to the test head 124 shown in FIG. 9B is 48, for example, although different maximum numbers of pin modules 120 may be incorporated without departing from the scope of the present teachings. The test head 124 may have a cover to protect and/or hide the connection terminals.

The layout illustrated in FIG. 9A and FIG. 9B, which arranges the pin modules 120 in a radial pattern in the test head 124, is merely an example, and the pin modules 120 may be arranged in various patterns in the test head 124, without departing from the scope of the present teachings. For instance, the pin modules 120 may be grouped and arranged on a group-by-group basis so that each group is parallel to one of the four side surfaces of the test head 124. Also, the surface of the pin module 120 may be located at the side surface of the test head 124. Such modifications of various structures in the test head 124, too, are to be interpreted as being within the scope of the present teachings.

Figure 10:
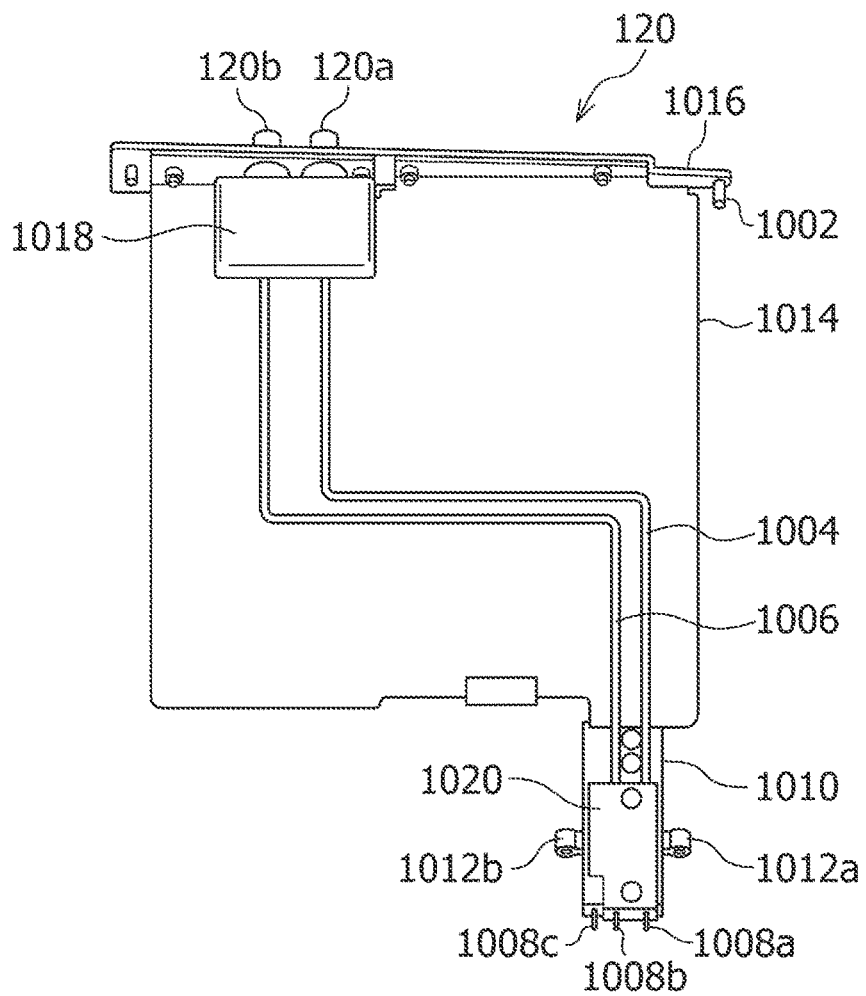
FIG. 10 is a perspective view of a pin module, according to a representative embodiment.

FIG. 10 is a perspective view of a pin module, according to a representative embodiment. Referring to FIG. 10, description is provided of the structure of each pin module 120. As illustrated in the perspective view of FIG. 10, the pin module 120 includes a decorative board 1016, a main body substrate 1014, and the pogo block 1010.

The decorative board 1016 forms a surface flush with the upper surface 130 of the test head 124 when the pin module 120 is fixed to the test head 124. The decorative board 1016 improves the external appearance of the mounted pin module 120 by painting or other measures, and also improves strength so that the pin module 120 is able to withstand a load applied when a connector is mounted or removed.

The decorative board 1016 may have a wedge shape, for example, as viewed from above. At the tip of the wedge shape of the decorative board 1016, an interlock pin 1002 protruding downward is provided. The interlock pin 1002 is a mechanism for enabling the test head side to detect that the pin module 120 is mounted by depressing the tip of a projection of one of the slot interlock switches 906, as described below, when the pin module 120 is mounted to the test head 124, and thus closing the corresponding slot interlock switch 906.

The pogo block 1010 includes a contact probe mounting holder 1020, which provides the pin module 120 with contact probes 1008a, 1008b, and 1008c (illustrated as the contact probes 120a, 120b, and 120c in FIG. 1), and to which the contact probes 1008a, 1008b, and 1008c are mounted. The pogo block 1010 also has screw holes 1012a and 1012b for positioning on the lower surface 132 (FIG. 9A) of the test head 124 when the pin module 120 is mounted. The contact probe mounting holder 1020 is also configured to convert the connection of signals transmitted from the connection terminals 120a and 120b by cables as described below, and then connect the signals to the contact probes 1008a, 1008b, and 1008c.

The main body substrate 1014 is structured to come into contact with a relevant inner guide rail (904) and a relevant outer guide rail (902) when the pin module 120 is inserted in the test head 124, and to support the decorative board 1016 and the pogo block 1010. The main body substrate 1014 is further structured to bear a connection terminal mounting module 1018, which supports the connection terminals 120a and 120b, and to bear a mechanism with which signals transmitted to the connection terminals 120a and 120b are transmitted to the pogo block 1010. The connection terminals 120a and 120b extend from the connection terminal mounting module 1018, pierce the decorative board 1016, and protrude above the decorative board 1016.

The connection terminals 120a and 120b in the pin module 120 in FIG. 10 may both be coaxial connectors, for example, which are connected to coaxial cables 1004 and 1006, respectively, by the connection terminal mounting module 1018. Signals from the coaxial cables 1004 and 1006 are reconnected to the three contact probes 1008a, 1008b, and 1008c by the contact probe mounting holder 1020. For example, a signal transmitted from the connection terminal 120a to a core portion of the coaxial cable 1004 is connected to the contact probe 1008a, a signal transmitted from the connection terminal 120b to a core portion of the coaxial cable 1006 is connected to the contact probe 1008b, and a signal transmitted from the connection terminal 120a to an outer conductor of the coaxial cable 1004 and a signal transmitted from the connection terminal 120b to an outer conductor of the coaxial cable 1006 are both connected to the contact probe 1008c.

The pin module 120 structured as above is capable of connection conversion from the connection terminals 120a and 120b into the contact probes 1008a to 1008c. The connection terminals may be composed of the connectors with cables. The pogo block 1010 may be separated from the body substrate and the contact probes 1008a, 1008b, and 1008c may be connected to signals from the connection terminals 120a and 120b by cables. Various embodiments further are capable of connection conversion from various connection terminals (i.e., connectors) that receive signals from various types of instruments into contact probes by changing pin modules.

Figure 11:
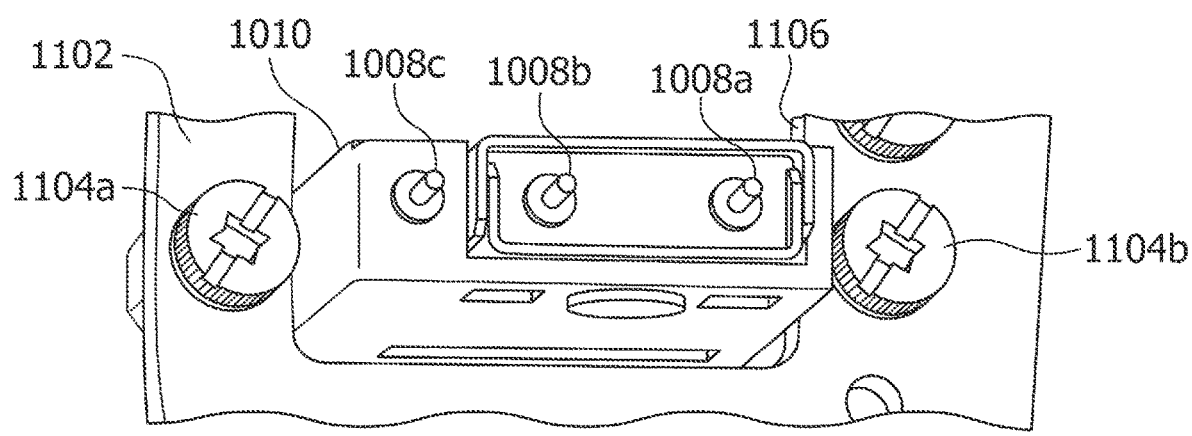
FIG. 11 is a perspective view for illustrating mounting of the pin module in FIG. 10 to the test head, according to a representative embodiment.

Next, with reference to FIG. 11 to FIG. 14, description is provided of a mechanism for fixing the pogo block 1010 of the pin module 120 to the lower surface 132 of the test head 124. FIG. 11 is a perspective view illustrating mounting of the pin module 120 in FIG. 10 to the test head 124, according to a representative embodiment. In FIG. 11, a panel, referred to as pogo panel 1102 for purposes of explanation, is mounted to the lower surface 132 of the test head 124, and the pogo block 1010 is mounted to the pogo panel 1102. The pogo block 1010 has two screw holes 1012a and 1012b, as illustrated in FIG. 10.

Figure 12:
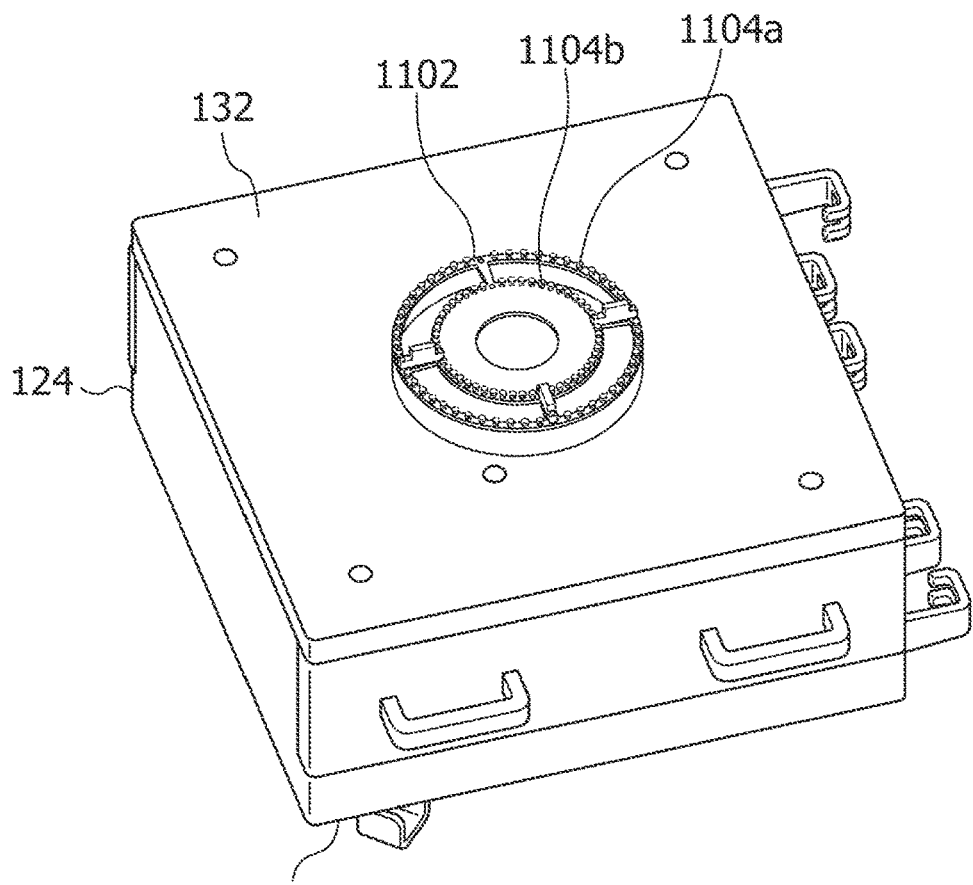
FIG. 12 is a perspective view of the test head as viewed from a lower surface of the test head in which pin modules are yet to be mounted, according to a representative embodiment.
Figure 13:
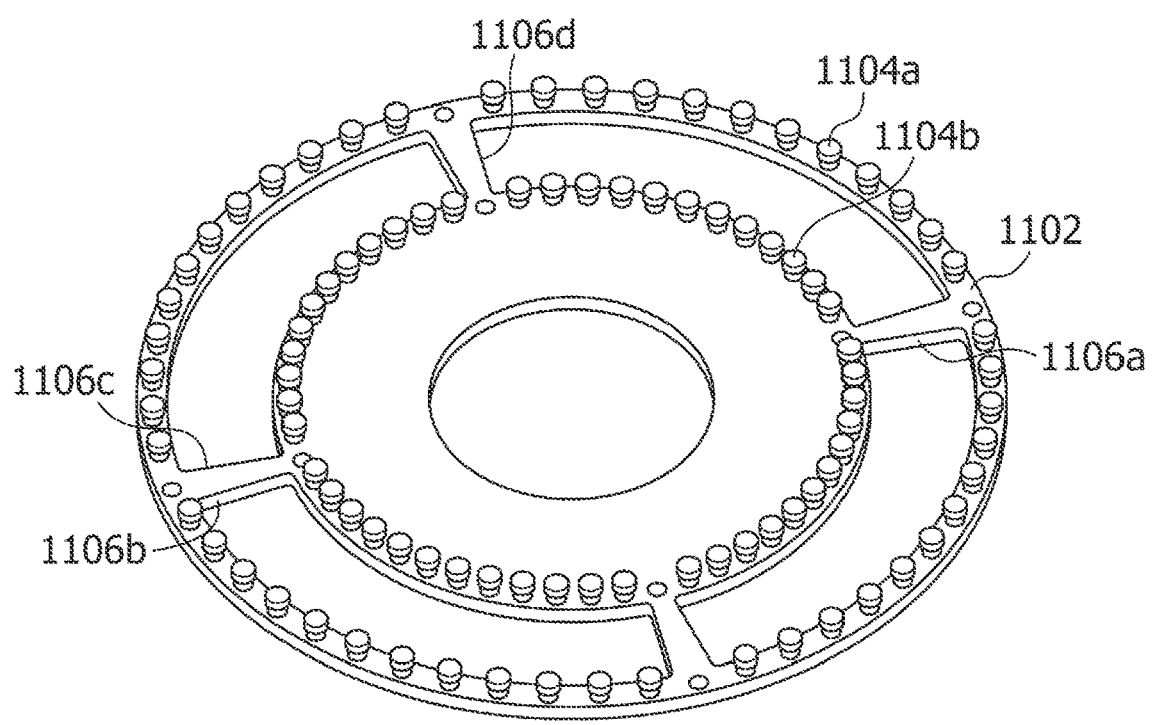
FIG. 13 is a perspective view for illustrating a pogo panel in FIG. 12, according to a representative embodiment.

FIG. 12 is a perspective view of the test head 124 as viewed from a lower surface 132 of the test head 124 in which pin modules 120 are not yet mounted, and FIG. 13 is a perspective view for illustrating the pogo panel 1102 in FIG. 12, according to a representative embodiment. As illustrated in FIG. 13, the pogo panel 1102 is a ring-like member in which four arc-shaped openings 1106a, 1106b, 1106c and 1106d together form a ring pattern. The pogo panel 1102 is provided with captive screws for fastening by forming pairs of captive screws from captive screws 1104b arranged along the inner arcs of the openings 1106a to 1106d and captive screws 1104a arranged along the outer arcs of the openings 1106a to 1106d. FIG. 12 is a perspective view as viewed from the lower surface 132 of the test head 124, with no pin modules mounted to the test head 124. The pogo panel 1102 in FIG. 13 is placed at the center of the lower surface 132, and the four openings 1106a to 1106d form openings leading to the inside of the test head 124.

When the tip of the pogo block 1010 of the pin module 120 in FIG. 10 is inserted from the same side as the upper surface 130 of the test head 124 in FIG. 12 and pierces one of the openings 1106a to 1106d, the screw holes 1012a and 1012b of the pogo block 1010 engage with a pair of captive screws 1104a and 1104b located at a corresponding position, out of the captive screws 1104a and 1104b provided on both sides of each opening.

The captive screws 1104a and 1104b, which do not fall out of the pogo panel 1102 when loosened, enable a worker to efficiently fix the pogo block 1010 of each pin module 120 to a given place in the pogo panel 1102, and to install the contact probes 1008a, 1008b, and 1008c of each pin module 120 at accurate positions with ease. In other words, with the mechanism of mounting the pogo block 1010 and the pogo panel 1102 described above, the contact probes 1008a, 1008b, and 1008c mounted to the pogo panel 1102 may be positioned accurately on the lower surface 132 of the test head 124, based on the accumulated difference of a distance from the inner guide rail 904 and outer guide rail 902 of the test head 124 to the pogo panel 1102.

FIG. 14 is a perspective view of the test head 124 as viewed from the lower surface 132 of the test head 124 in which all pin modules 120 are installed in the test head 124, according to a representative embodiment, as described above. The contact probe 1008a is installed at an innermost position in the ring-pattern arrangement, and the contact probe 1008c is installed at an outermost position in the ring-pattern arrangement. The arrangement of a pair of captive screws 1104a and 1104b with which each pogo block 1010 is fixed is illustrated as well.

The shape of the pogo panel and/or how the pin modules are arranged to be mounted may vary, without departing from the scope of the present teachings.

Figure 15A:
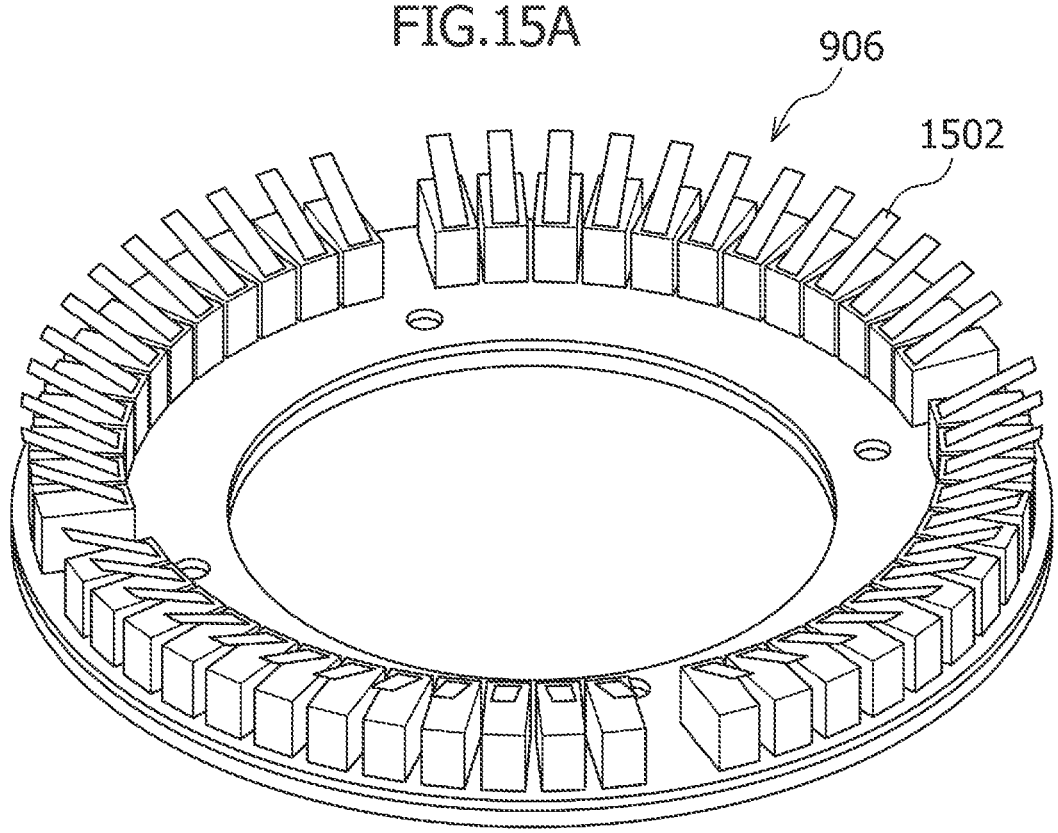
FIG. 15A is a perspective view for illustrating slot interlock switches in FIG. 9A, according to a representative embodiment.
Figure 15B:
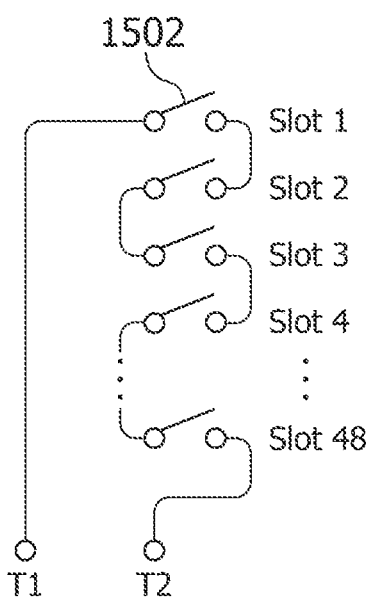
FIG. 15B is a circuit diagram of the slot interlock switches, according to a representative embodiment.
Figure 17:
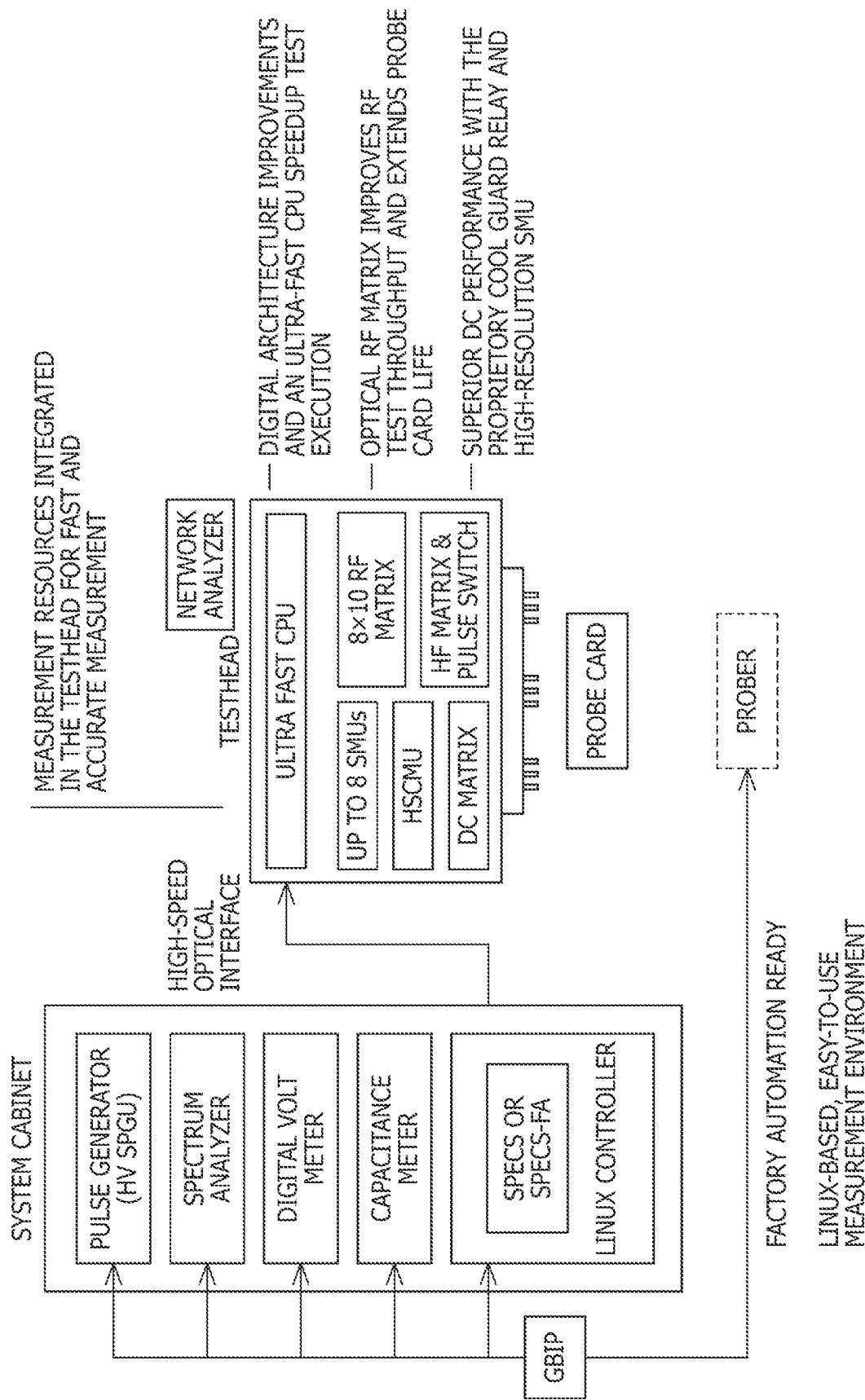
FIG. 17 is a block diagram of a conventional semiconductor parametric test system.
Figure 18:
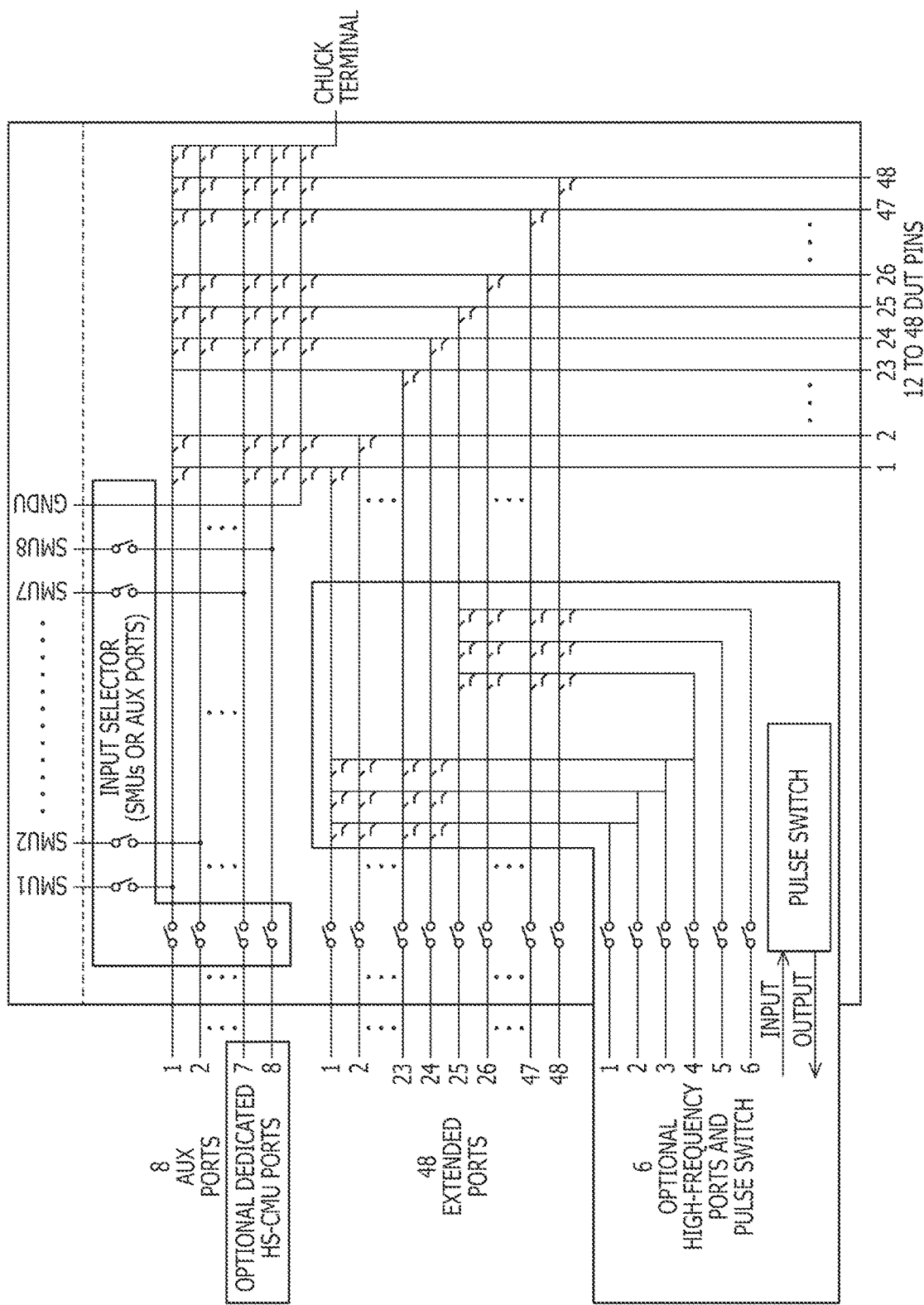
FIG. 18 is a schematic diagram of a conventional test head circuit of a conventional semiconductor parametric test system.

FIG. 15A is a perspective view for illustrating slot interlock switches 906 in FIG. 9A, and FIG. 15B is a circuit diagram of the slot interlock switches 906, according to a representative embodiment. Referring to FIG. 15A and FIG. 15B, description is also provided for the interlock pin 1002 of the pin module 120 in FIG. 10. The slot interlock switches 906 are provided inside the cylinder 908 of the test head 124 as illustrated in FIG. 9A. Each of the slot interlock switches 906 is a switch having a jutting tip 1502. The number of slot interlock switches 906 is the same as the number of slots for pin modules 120 arranged into a ring pattern. When a pin module 120 is mounted to the test head 124, the interlock pin 1002 depresses the tip 1502 of one of the slot interlock switches 906 at the corresponding position inside the cylinder 908, thereby closing the slot interlock switch 906 at the corresponding position.

The slot interlock switches 906 may be arranged in a circuit as illustrated in FIG. 15B, for example. The slot interlock switch 906 associated with Slot 1 to the slot interlock switch 906 associated with Slot 48 are connected so that the positive side of one slot interlock switch 906 and the negative side of its adjacent slot interlock switch 906 are short-circuited as illustrated. Thus, when all of the slot interlock switches 906 are closed, whether all pin modules 120 are mounted can be detected from the state of a signal flowing between a terminal T1 and a terminal T2. Accordingly, the test system can be built so that, for security, a signal cannot be output from a measurement instrument unless all pin modules are mounted when the test system is put into operation. This protects workers, for example, from hazardous electric potentials of the test head interior and a probe card.

A blank pin module may be installed to/from which no signal is input/output electrically in each slot in which no function is needed for pin modules 120 inside the test head 124. The blank pin module may not include one or more of components shown in FIG. 10, for example, such as the connection terminals 120a and 120b, the connection terminal mounting module 1018, the coaxial cables 1004 and 1006, the contact probe mounting holder 1020, and the contact probes 1008a, 1008b, and 1008c, while still including at least the interlock pin 1002 and the screw holes 1012a and 1012b for fixing the pogo block 1010. This may reduce the cost of the test system.

FIG. 16 is a perspective view of a pin module, according to another representative embodiment. Referring to FIG. 16, description is provided of a pin module 1600 of a test system. The same parts described above, e.g., with reference to the pin module 120, are denoted by the same reference symbols.

The pin module 1600 differs from the pin module 120 shown in FIG. 10 in that signal paths from the connection terminals to the pogo block 1010 are conductive patterns formed on a main body substrate 1604 instead of cables (e.g., coaxial cables 1004 and 1006). The main body substrate 1604 is provided with a connection terminal mounting module 1606 for the connection terminals 120a and 120b. Multiple conductive patterns are formed on the main body substrate 1604 from the connection terminal mounting module 1606 to the pogo block 1010, although hidden from sight by shield members 1602 and 1610. The shield members 1602 and 1610, which are made of metal, for example, are provided above the conductive patterns as covers, improving insulation performance over lines built from a conductive pattern on a normal substrate.

A holder 1608 for the pin module 1600 is substantially the same as the contact probe mounting holder 1020 in FIG. 10. The holder 1608 thus provides the pin module 1600 with the contact probes 1008a, 1008b, and 1008c.

The pin module 1600 has an advantage over the pin module 120 in that an alteration for acquiring an added value in addition to the simple function of outputting a signal to a contact probe is easily made by mounting a relay and/or other electronic parts on the pin module 1600.

A pin module of a test system according to yet another representative embodiment is configured so that a control line from the controller is connected, and the number of connection terminals for cables from the cabinet is increased. Thus, multiple measurement functions may be provided by mounting a relay and/or an analog or digital active element on the main body substrate to switch signal lines.

A signal line and connectors conforming to the USB standards or the like may be used as the control line from the controller, for example.

The representative embodiments of the present invention described above are intended to be examples. One skilled in the art would be able to make various modifications, substitutions, and alterations without departing from the scope of the present teachings.

The cabinet of the wafer test system according to the embodiments is configured so that a space in the cabinet in front of the front surfaces of multiple instruments mounted in the cabinet is separated from a space in the cabinet behind the front surfaces of the mounted instruments. The cabinet accommodates mounted instruments that are structured to take in air through an air inlet on one of its side surfaces, since the cabinet includes an air intake panel with an air intake guide through which air outside the cabinet is directly taken in, where the air intake panel is positioned proximate to the air inlet on one of the side surfaces of the mounted instrument. The cabinet includes a blank panel by which ventilation to and from the outside is blocked on the cabinet's side surface, which may correspond to another side surface of the mounted instrument, such that the mounted instrument is able to exhaust air from the side surface and/or from its rear.

Various instruments mounted in the cabinet irrespective of whether air is taken in from the right side surface, the left side surface, or the front surface of the instrument can accordingly operate without lowering the cooling efficiency of each instrument. The cabinet is therefore easy and flexible in design, so that an additional instruments can be mounted in the cabinet, including new or different instruments for which the cabinet was not specifically designed.

In contrast, the cabinet in a conventional wafer test system lets the intake air and exhaust air of instruments mounted in the cabinet mix. This lowers the cooling efficiency of each instrument and hinders the instrument from delivering its designed performance. A conventional wafer test system also has difficulty adding a new signal path in the test head because some measurement resources are mounted in the cabinet, while others are mounted in the test head. The signal paths and control paths are therefore complicated.

In the embodiments of the cabinet, on the other hand, measurement resources are mounted only in the cabinet, which means that control paths to the measurement resources are mostly inside the cabinet, and signal paths from the cabinet to the test head are simplified as well. It is also easy to control and add an instrument because the test head of the various embodiments receives a signal from the cabinet basically with a pin module. Simple and single-function pin modules, which output to the control probes without an intervening relay or active element, are mounted to the test head. In addition, with pin modules, a change in connector shape can easily be accommodated for each measurement resource separately, which enables the wafer test system to handle an addition of a measurement resource flexibly in any manner.

Overall, the test system according to various embodiments of the present invention enable the latest technological demands in the field of wafer testing to be met. The test system may be built flexibly, by giving the cabinet of the test system the structure described above in which measurement resources to be mounted can be concentrated in the cabinet and, at the same time, degradation in cooling efficiency is prevented. Also, by housing in the test head multiple single-function pin modules that receive a signal from the cabinet on a measurement resource-by-measurement resource basis, and output the received signal in a contact probe format.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed:

1. A wafer test system comprising:
a cabinet comprising at least one front door, a left side panel, a right side panel, a rear door, a ceiling unit, and a bottom unit, the cabinet being configured to house a plurality of instruments, wherein each of the plurality of instruments in the cabinet has a front surface, a left side surface, a right side surface, and a rear surface;
a test head comprising a plurality of pin modules; and
a plurality of cables configured to connect at least some of the plurality of instruments to the plurality of pin modules,
wherein the at least some of the plurality of instruments connected to the plurality of pin modules each include at least one first connection terminal, wherein the cabinet further comprises:
a first space defined in the cabinet between the at least one front door and the front surface of each of the plurality of instruments; and
a second space defined in the cabinet between the rear door and the rear surface of each of the plurality of instruments, the first space and the second space being separated in the cabinet to separate intake air and exhaust air of the plurality of instruments in the cabinet,
wherein one or more of the plurality of instruments have air inlets on the left side surfaces and/or the right side surfaces thereof, and the cabinet further comprises air intake panels on the left side panel and/or the right side panel of the cabinet corresponding to the air inlets, the air intake panels each including a tubular member, which extends from the air inlet and pierces through the left side panel or the right side panel of the cabinet,
wherein one or more of the plurality of instruments have no air inlets on the left side surfaces and/or the right side surfaces thereof, and the cabinet further includes first separation panels, which are configured to separate air inside the cabinet and air outside the cabinet, corresponding to the left side surfaces and/or right side surfaces of the one or more of the plurality of instruments having no air inlets, and
wherein each of the plurality of pin modules includes at least one second connection terminal for connecting to the at least one first connection terminal of an instrument of the at least some of the plurality of instruments connected to the plurality of pin modules.

2. The wafer test system according to claim 1, wherein some of the plurality of pin modules are configured to connect a signal transmitted to the at least one second connection terminal by at least one cable.

3. The wafer test system according to claim 1, wherein some of the plurality of pin modules are configured to connect a signal transmitted to the at least one second connection terminal to at least one contact probe by at least one conductive pattern on a substrate.

4. The wafer test system according to claim 1, wherein the at least one first connection terminal and the at least one second connection terminal include a coaxial connector or a triaxial connector.

5. The wafer test system according to claim 1, wherein the cabinet further includes a plurality of second separation panels configured to separate the first space and the second space in the cabinet, the plurality of second separation panels covering gaps between left and right edges of the front surfaces of the plurality of instruments and left and right side panels of the cabinet.

6. The wafer test system according to claim 1, wherein the cabinet further includes a third separation panel configured to cover from an upper edge of the front surface of at least one of the plurality of instruments to the ceiling unit of the cabinet, and/or a fourth separation panel configured to cover from a lower edge of the front surface of at least another of the plurality of instruments to the bottom unit of the cabinet, for separating the first and second spaces.

7. The wafer test system according to claim 1, wherein the cabinet further includes a fifth separation panel configured to cover from a lower edge of the front surface of one of the plurality of instruments to an upper edge of the front surface of another of the plurality of instruments.

8. The wafer test system according to claim 1, wherein the ceiling unit of the cabinet has an opening leading to the first space.

9. The wafer test system according to claim 1, wherein the cabinet further includes, on an inner side of the rear door, an air exhaust unit configured to exhaust air in the second space to a space below the cabinet.

10. The wafer test system according to claim 1, wherein at least one of the plurality of instruments comprises a measurement instrument, and at least one of the plurality of instruments comprises a controller including a computer.

11. The wafer test system according to claim 1, wherein:
each of the plurality of pin modules includes an interlock pin, and the test head includes a plurality of interlock switches, and
the interlock pin engages with a corresponding one of the plurality of interlock switches when the plurality of pin modules are mounted to the test head, thereby enabling the test head to detect that the plurality of pin modules are mounted.

12. The wafer test system according to claim 1, wherein each of the plurality of pin modules is mounted to the test head with captive screws included in the test head.

13. A wafer test system comprising:
a cabinet housing a plurality of instruments;
a test head comprising a plurality of slots for receiving a plurality of insertable pin modules, respectively; and
a plurality of cables configured to connect some of the plurality of instruments to the plurality of pin modules,
wherein each instrument of the some of the plurality of instruments includes at least one first connection terminal,
wherein each pin module of the plurality of insertable pin modules includes at least one second connection terminal, provided on an upper surface side of the pin module for directly connecting the pin module to a corresponding at least one cable of the plurality of cables, and at least one contact probe, provided on a lower surface side of the pin module for contacting a probe card, and
wherein each pin module of the plurality of pin modules are is configured to convert connection of a signal received at the at least one second connection terminal into the at least one contact probe.

14. The wafer test system according to claim 13, wherein the plurality of pin modules are further configured to connect the signal transmitted to the at least one second connection terminal to the at least one contact probe by at least one cable, or by at least one conductive pattern on a substrate.

15. A wafer test system comprising:
a cabinet comprising at least one front door, a left side panel, a right side panel, a rear door, a ceiling unit, and a bottom unit, the cabinet being configured to house a plurality of instruments, each of the plurality of instruments having a front surface, a left side surface, a right side surface, and a rear surface, wherein some of the plurality of instruments each include at least one first connection terminal; and
a plurality of cables configured to connect to the some of the plurality of instruments,
wherein the cabinet further includes a first space defined in the cabinet between the at least one front door and the front surface of each of the plurality of instruments, and a second space defined in the cabinet between the rear door and the rear surface of each of the plurality of instruments, wherein the first space and the second space are separated in the cabinet to separate intake air and exhaust air of the plurality of instruments,
wherein the cabinet further includes air intake panels on the left side panel and/or the right side panel of the cabinet corresponding to air inlets on left side surfaces and/or right side surfaces of one or more of the plurality of instruments, the air intake panels each including a tubular member extending from a corresponding air inlet and through the left side panel and/or the right side panel of the cabinet, and
wherein the cabinet further includes a plurality of first separation panels configured to separate air inside the cabinet and air outside the cabinet, for corresponding to left side surfaces and/or right side surfaces of one or more of the plurality of instruments having no air inlets.

16. The wafer test system according to claim 15, wherein the cabinet further comprises a plurality of second separation panels separating the first space and the second space in the cabinet, the plurality of second separation panels covering gaps between left and right edges of the front surfaces of the plurality of instruments and left and right side panels of the cabinet.

17. The wafer test system according to claim 15, wherein the cabinet further comprises a third separation panel configured to cover from an upper edge of the front surface of at least one of the plurality of instruments to the ceiling unit of the cabinet, and/or a fourth separation panel configured to cover from a lower edge of the front surface of at least another of the plurality of instruments to the bottom unit of the cabinet, for separating the first and second spaces.

18. The wafer test system according to claim 15, wherein the cabinet further comprises a fifth separation panel configured to cover from a lower edge of the front surface of one of the plurality of instruments to an upper edge of the front surface of another of the plurality of instruments.

19. The wafer test system according to claim 15, wherein the ceiling unit of the cabinet has an opening leading to the first space.

20. The wafer test system according to claim 15, wherein the cabinet further includes, on an inner side of the rear door, an air exhaust unit configured to exhaust air in the second space to a space below the cabinet.

* * * * *

UNITED STATES PATENT AND TRADEMARK OFFICE
CERTIFICATE OF CORRECTION

PATENT NO. : 10,845,383 B2
APPLICATION NO. : 16/173359
DATED : November 24, 2020
INVENTOR(S) : Kenichi Takano et al.

It is certified that error appears in the above-identified patent and that said Letters Patent is hereby corrected as shown below:

In the Claims

In Column 22, Line 59, in Claim 13, before "is" delete "are".

In Column 23, Line 31, in Claim 15, before "corresponding" delete "for".

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*